United States Patent
Hayashi

(10) Patent No.: US 10,427,402 B2
(45) Date of Patent: Oct. 1, 2019

(54) PRINTING APPARATUS AND POWER SUPPLY UNIT FOR PRINTING APPARATUS

(71) Applicant: SEIKO EPSON CORPORATION, Tokyo (JP)

(72) Inventor: Katsuhiko Hayashi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/919,603

(22) Filed: Mar. 13, 2018

(65) Prior Publication Data

US 2018/0272693 A1 Sep. 27, 2018

(30) Foreign Application Priority Data

Mar. 23, 2017 (JP) ................. 2017-057369

(51) Int. Cl.
| | |
|---|---|
| B41J 29/38 | (2006.01) |
| B41J 2/045 | (2006.01) |
| H05K 1/18 | (2006.01) |
| H05K 1/11 | (2006.01) |
| H05K 1/02 | (2006.01) |
| H01G 4/228 | (2006.01) |
| H01G 4/30 | (2006.01) |
| H01G 2/06 | (2006.01) |

(52) U.S. Cl.
CPC ......... *B41J 2/0457* (2013.01); *B41J 2/04541* (2013.01); *B41J 2/04548* (2013.01); *B41J 2/04581* (2013.01); *B41J 2/04588* (2013.01); *B41J 2/04593* (2013.01); *B41J 2/04596* (2013.01); *H05K 1/0231* (2013.01); *H05K 1/112* (2013.01); *H05K 1/181* (2013.01); *H01G 2/065* (2013.01); *H01G 4/228* (2013.01); *H01G 4/30* (2013.01); *H05K 1/113* (2013.01); *H05K 2201/10015* (2013.01); *H05K 2201/10522* (2013.01); *H05K 2201/10636* (2013.01)

(58) Field of Classification Search
USPC ............................................... 347/5; 330/302
See application file for complete search history.

(56) References Cited

U.S. PATENT DOCUMENTS

| | | | |
|---|---|---|---|
| 6,177,841 B1 * | 1/2001 | Ohta ..................... | H03F 1/0205 330/302 |
| 2007/0216714 A1 * | 9/2007 | Sato ....................... | B41J 2/0458 347/5 |

FOREIGN PATENT DOCUMENTS

JP 2008-187269 8/2008

* cited by examiner

*Primary Examiner* — Lam S Nguyen

(57) ABSTRACT

The power supply unit includes a circuit substrate including a first layer that is a surface layer being conductive, a first wiring pattern formed of the first layer, a second layer that is conductive, and a second wiring pattern formed of the second layer, and first and second capacitors formed on the first layer. The first capacitor includes a first terminal and a second terminal. The second capacitor includes a third terminal and a fourth terminal. The circuit substrate includes a first electrode connecting the first terminal of the first capacitor to the first wiring pattern, a second electrode connecting the second terminal of the first capacitor to the second wiring pattern, a third electrode connecting the third terminal of the second capacitor to the second wiring pattern, and a fourth electrode connecting the fourth terminal of the second capacitor to the first wiring pattern.

12 Claims, 17 Drawing Sheets

|  | SI[m]<br>(b1, b2) | Ts1 | | Ts2 | |
| --- | --- | --- | --- | --- | --- |
|  |  | SLa[m] | SLb[m] | SLa[m] | SLb[m] |
| LARGE DOT | (1, 1) | H | L | H | L |
| MIDDLE DOT | (1, 0) | H | L | L | H |
| SMALL DOT | (0, 1) | L | H | H | L |
| NON-DISCHARGE | (0, 0) | L | H | L | H |

PRINTING APPARATUS AND POWER SUPPLY UNIT FOR PRINTING APPARATUS

This application claims priority to Japanese Patent Application No. 2017-057369 filed on Mar. 23, 2017. The entire disclosure of Japanese Patent Application No. 2017-057369 is hereby incorporated herein by reference.

BACKGROUND

1. Technical Field

The present invention relates to a printing apparatus and a power supply unit for a printing apparatus.

2. Related Art

In recent years, printing apparatuses tend to have more functionality. For example, a multifunctional printing apparatus has been developed. The multifunctional printing apparatus has a printing function of executing a printing process of forming an image on a recording medium (hereinafter merely referred to as "medium" in some cases) and at least one of functions of executing various processes (refer to, for example, JP-A-2008-187269). The functions of executing the various processes are, for example, a copy function of executing a copy process, a scanner function of executing a reading process of reading an image printed on a recording medium or the like, a facsimile function of executing a facsimile transmission process of transmitting and receiving image data to and from another printing apparatus via a network, and the like.

In general, if a printing apparatus has more functionality, and the resolution and speed of printing of the printing apparatus are increased, the amount of power to be consumed by the printing apparatus increases. Thus, in order to stabilize a power source of a power supply unit for supplying power to sections, a capacitor that has a relatively large capacitance and is referred to as decoupling capacitor is connected to a power line.

However, if a self-resonant frequency of such capacitor is low, the low self-resonant frequency may cause a failure of the printing apparatus, such as the instability of the power line or the occurrence of noise in the power line.

SUMMARY

An advantage of some aspects of the invention is to provide a technique for increasing a self-resonant frequency of a capacitor connected to a power line in a power supply unit included in a printing apparatus.

According to an aspect of the invention, a printing apparatus includes a plurality of operating units including a printing unit that forms an image on a medium and a power supply unit that supplies power to the plurality of operating units. The printing apparatus has a plurality of functions including a printing function of forming an image on a medium and is capable of executing printing with resolution of 300 dpi or more. The power supply unit includes a circuit substrate including a first layer that is a surface layer being conductive, a first wiring pattern formed of the first layer, a second layer that is conductive and different from the first layer, and a second wiring pattern formed of the second layer, and first and second capacitors formed on the surface layer. The first capacitor includes a first terminal and a second terminal. The second capacitor includes a third terminal and a fourth terminal. The circuit substrate includes a first electrode connecting the first terminal of the first capacitor to the first wiring pattern, a second electrode connecting the second terminal of the first capacitor to the second wiring pattern, a third electrode connecting the third terminal of the second capacitor to the second wiring pattern, and a fourth electrode connecting the fourth terminal of the second capacitor to the first wiring pattern.

In the printing apparatus according to the aspect, self-resonant frequencies of the capacitors included in the power supply unit can be high.

It is preferable that, in the printing apparatus according to the aspect, the first wiring pattern include a wiring portion between regions in which the first and second capacitors are mounted.

It is preferable that, in the printing apparatus according to the aspect, the second wiring pattern be located on a low-voltage side of the power supply unit.

It is preferable that, in the printing apparatus according to the aspect, a first direction from the first terminal to the second terminal and a second direction from the third terminal to the fourth terminal be substantially parallel to a power transmission direction from a power supply component side of a power line to a load component side of the power line on the circuit substrate.

It is preferable that, in the printing apparatus according to the aspect, the second wiring pattern be a solid-like pattern located on a low-voltage side of the power supply unit, and the second electrode and the third electrode be connected to the second wiring pattern through vias.

It is preferable that, in the aforementioned configuration, each of the first and second capacitors have a multilayer structure in which an electrode layer and a dielectric layer are stacked, and at least one of stacking directions of the first and second capacitors be substantially parallel to a surface of the circuit substrate on which components are mounted.

It is preferable that, in the printing apparatus according to the aspect, the first wiring pattern include a wiring portion between regions in which the first and second capacitors are mounted, and the second wiring pattern be located on a low-voltage side of the power supply unit.

According to another aspect of the invention, a printing apparatus includes a plurality of operating units including a printing unit that forms an image on a medium and a power supply unit that supplies power to the plurality of operating units. The printing apparatus has a plurality of functions including a printing function of forming an image on a medium and is capable of executing printing with resolution of 300 dpi or more. The power supply unit supplies power for driving the printing apparatus by using a first capacitor including an electrode layer and a dielectric layer that are stacked in a first stacking direction, a second capacitor including an electrode layer and a dielectric layer that are stacked in a second stacking direction, an element to which power is supplied, and a circuit substrate on which a power line for supplying power to the element is formed. The first capacitor and the second capacitor are mounted side by side on the circuit substrate. A terminal of the first capacitor is connected to the power line. A terminal of the second capacitor is connected to the power line. The first stacking direction or the second stacking direction is parallel to a surface of the circuit substrate on which components are mounted.

In the printing apparatus according to the other aspect, self-resonant frequencies of the capacitors included in the power supply unit can be high.

It is preferable that, in the printing apparatus according to the other aspect, the second capacitor be mounted in a range affected by a magnetic field generated by the first capacitor, and the first capacitor be mounted in a range affected by a magnetic field generated by the second capacitor.

The invention is not limited to the printing apparatuses and can be achieved in various aspects. For example, the invention can be achieved as a power supply unit for a printing apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
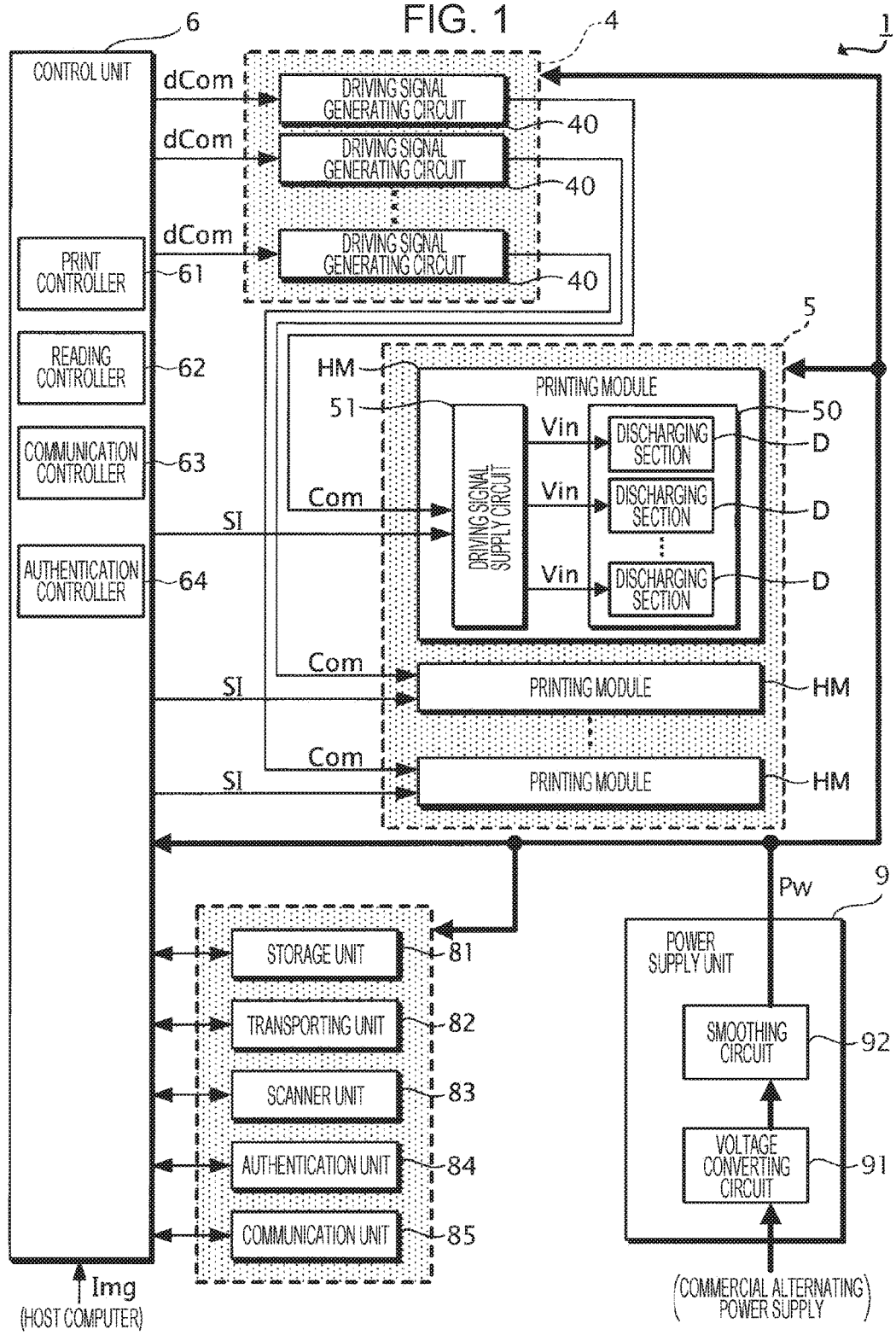
FIG. 1 is a block diagram illustrating an example of the configuration of a printing apparatus according to an embodiment of the invention.

Hereinafter, embodiments of the invention are described with reference to the accompanying drawings. In the drawings, dimensions and reduced scale of units are different from those of the actual units for convenience sake. In addition, since the following embodiments are preferred specific examples of the invention, technically preferable limitations are imposed. However, unless a description that limits the invention is included in the following description, the scope of the invention is not limited to the embodiments.

An embodiment describes, as a liquid discharging apparatus, an ink jet printer that discharges liquid ink and forms an image on a recording medium P.

FIG. 1 is a functional block diagram illustrating an example of the configuration of an ink jet printer 1. Printing data Img that indicates an image to be formed by the ink jet printer 1 is supplied to the ink jet printer 1 from a host computer (not shown) such as a personal computer or a digital camera. The ink jet printer 1 executes a printing process of forming, on the recording medium P, the image indicated in the printing data Img supplied from the host computer.

Although details are described later, the ink jet printer 1 according to the embodiment has a printing function of executing the aforementioned printing process, a copy function, a scanner function, a facsimile function, and an authentication function.

The copy function is to execute a copy process of copying an image printed on the recording medium P. The scanner function is to execute a reading process of reading the image printed on the recording medium P, generating image data Dat indicating the read image, and causing the generated image data Dat to be stored in an external storage device (for example, a storage device installed in the host computer) of the ink jet printer 1 or a storage unit 81 included in the ink jet printer 1. The facsimile function includes a transmission function and a reception function. The transmission function is to execute a facsimile transmission process of transmitting the image data Dat obtained by reading the image printed on the recording medium P to an external device via a network such as a public line. The reception function is to execute a facsimile reception process of receiving image data Dat transmitted from the external device and forming an image on the recording medium P based on the received image data Dat. The authentication function is to execute an authentication process of executing authentication on a user of the ink jet printer 1.

In addition, although details are described later, it is assumed that the ink jet printer 1 is a line printer.

As illustrated in FIG. 1, the ink jet printer 1 includes a printing unit 5, a control unit 6, a power supply unit 9, a driving signal generating unit 4, a transporting unit 82, the storage unit 81, a scanner unit 83, an authentication unit 84, a communication unit 85, and a housing 1000. The printing unit 5 includes printing modules HM, each of which has discharging sections D for discharging ink. The control unit 6 controls operations of the units of the ink jet printer 1. The power supply unit 9 supplies power PW to the units of the ink jet printer 1. The driving signal generating unit 4 includes driving signal generating circuits 40 that generate driving signals Com for driving the printing unit 5 (specifically, the discharging sections D included in the printing unit 5). The transporting unit 82 changes a relative position of the recording medium P to the printing unit 5. The storage unit 81 stores a control program of the ink jet printer 1 and other information. The scanner unit 83 reads an image printed on the recording medium P. The authentication unit 84 executes authentication on the user of the ink jet printer 1. The communication unit 85 executes communication with the external device of the ink jet printer 1. The housing 1000 stores the units of the ink jet printer 1.

Hereinafter, the driving signal generating unit 4, the printing unit 5, the storage unit 81, the control unit 6, the transporting unit 7, the scanner unit 83, the authentication unit 84, and the communication unit 85 are referred to as "operating units" in some cases. In the ink jet printer 1, the power supply unit 9 supplies power PW to the multiple operating units included in the ink jet printer 1.

It is assumed that the printing unit 5 includes the four printing modules HM in the ink jet printer 1 and that the driving signal generating unit 4 includes the four driving signal generating circuits 40 that correspond to the four printing modules HM, respectively.

In the ink jet printer 1, each of the printing modules HM includes a print head 50 having a number M of discharging sections D and includes a driving signal supply circuit 51 that switches whether or not a driving signal Com output from the driving signal generating unit 4 is supplied to the print head 50 (M is a natural number satisfying $1 \leq M$ in this example).

Hereinafter, in order to distinguish a number M of discharging sections D included in each of the print heads 50, the number M of discharging sections are referred to as first, second, . . . , and M-th discharging sections D in some cases. In addition, an m-th discharging section D included in each of the print heads 50 is referred to as discharging section D[m] (a variable m is a natural number satisfying $1 \leq m \leq M$). Furthermore, in the case where a constituent element, a signal, or the like of the ink jet printer 1 corresponds to the number m of a discharging section D[m], an index [m] indicating that the constituent element, the signal, or the like corresponds to the number m of the discharging section D[m] is added to a symbol indicating the constituent element, the signal, or the like in some cases.

The storage unit 81 includes one or both of a volatile memory such as a random access memory (RAM) and a nonvolatile memory such as a read only memory (ROM), an electrically erasable programmable read only memory (EEPROM), or a programmable ROM (PROM) and stores the printing data Img supplied from the host computer and various types of information such as the control program of the ink jet printer 1.

The control unit 6 includes a central processing unit (CPU). The control unit 6 may include a programmable logic device such as a field-programmable gate array (FPGA) instead of the CPU or may include the CPU and the programmable logic device such as the FPGA.

The control unit 6 can function as a print controller 61, a reading controller 62, a communication controller 63, and an authentication controller 64 by causing the CPU included in the control unit 6 to execute the control program stored in the storage unit 81 and operating in accordance with the control program.

The print controller 61 generates printing signals SI for controlling the driving signal supply circuits 51 included in the printing unit 5, waveform specifying signals dCom for controlling the driving signal generating circuits 40 included in the driving signal generating unit 4, and a transport control signal for controlling the transporting unit 7.

The waveform specifying signals dCom are digital signals defining waveforms of driving signals Com.

The driving signals Com are analog signals for driving the discharging sections D. The driving signal generating circuits 40 include DA converting circuits and generate the driving signals Com having the waveforms defined in the waveform specifying signals dCom. It is assumed that, in the ink jet printer 1, each of the driving signals Com includes a driving signal Com-A and a driving signal Com-B.

In addition, the printing signals SI are digital signals for specifying types of operations of the discharging sections D. Specifically, the printing signals SI specify the types of the operations of the discharging sections D by specifying whether or not the driving signals Com are supplied to the discharging sections D. Specifying the types of the operations of the discharging sections D is to specify whether or not the discharging sections D are to be driven, or is to specify whether or not ink is discharged from the discharging sections D upon the driving of the discharging sections D, or is to specify the amounts of ink to be discharged from the discharging sections D upon the driving of the discharging sections D.

The reading controller 62 generates a scanner control signal for controlling the scanner unit 83. The communication controller 63 generates a communication control signal for controlling the communication unit 85. The authentication controller 64 generates an authentication control signal for controlling the authentication unit 84.

When the printing process is executed, the print controller 61 causes the printing data Img supplied from the host computer to be stored in the storage unit 81. Next, the print controller 61 generates various signals such as the printing signals SI, the waveform specifying signals dCom, and the transport control signal based on various types of data such as the printing data Img stored in the storage unit 81. Then, the print controller 61 controls the transporting unit 7 to cause the transporting unit 7 to change a relative position of the recording medium P to the printing unit 5 and controls the printing unit 5 to drive the discharging sections D based on the printing signals SI, the waveform specifying signals dCom, the transport control signal, and the various types of data stored in the storage unit 81. Thus, the print controller 61 adjusts whether or not the discharging sections D discharge ink, the amounts of ink to be discharged from the discharging sections D, the timing of the ink discharging, and the like, and controls the execution of the printing process of forming the image corresponding to the printing data Img on the recording medium P.

When the reading process is executed, the scanner unit 83 reads, based on the scanner control signal, an image printed on the recording medium P located at a position where the scanner unit 83 can read the image, and the scanner unit 83 generates image data Dat indicating the read image. Then, the reading controller 62 causes the image data Dat output from the scanner unit 83 to be stored in the storage unit 81 or an external storage device.

The copy process includes the reading process and the printing process.

In the copy process, the reading controller 62 executes the reading process and the scanner unit 83 generates the image data Dat. Next, the print controller 61 converts the image data Dat generated by the scanner unit 83 to printing data Img in a format suitable for the printing process of the ink jet printer 1 and causes the printing data Img to be stored in the storage unit 81. Next, the print controller 61 controls the units of the ink jet printer 1 in such a manner that the printing process is executed based on the printing data Img.

The facsimile transmission process includes the reading process and a process of transmitting the image data Dat. First, in the facsimile transmission process, the reading controller 62 executes the reading process and the scanner unit 83 generates the image data Dat. Next, the communication unit 85 transmits, based on the communication control signal, the image data Dat generated by the scanner unit 83 to the external device via the network.

The facsimile reception process includes a process of receiving image data Dat and the printing process. In the facsimile reception process, the communication unit 85 receives the image data Dat from the external device based on the communication control signal. Next, the print controller 61 converts the image data Dat received by the communication unit 85 to printing data Img in the format suitable for the printing process of the ink jet printer 1 and causes the printing data Img to be stored in the storage unit 81. Next, the print controller 61 controls the units of the ink jet printer 1 in such a manner that the printing process is executed based on the printing data Img.

When the authentication process is executed, the authentication unit 84 reads, based on the authentication control signal, authentication information that is to be used for user authentication and is biological information of the user, IC card information recorded in an IC card owned by the user, or the like. Then, the authentication controller 64 executes authentication on the user based on, for example, information related to the user and stored in the storage unit 81 and the authentication information read by the authentication unit 84.

The power supply unit 9 includes a voltage converting circuit 91 and a smoothing circuit 92. The voltage converting circuit 91 transforms an alternating voltage supplied from a commercial alternating power supply and outputs the alternating voltage after the transformation to the smoothing circuit 92. The smoothing circuit 92 smooths the alternating voltage output from the voltage converting circuit 91 to convert the alternating voltage to a direct-current voltage.

Figure 2:
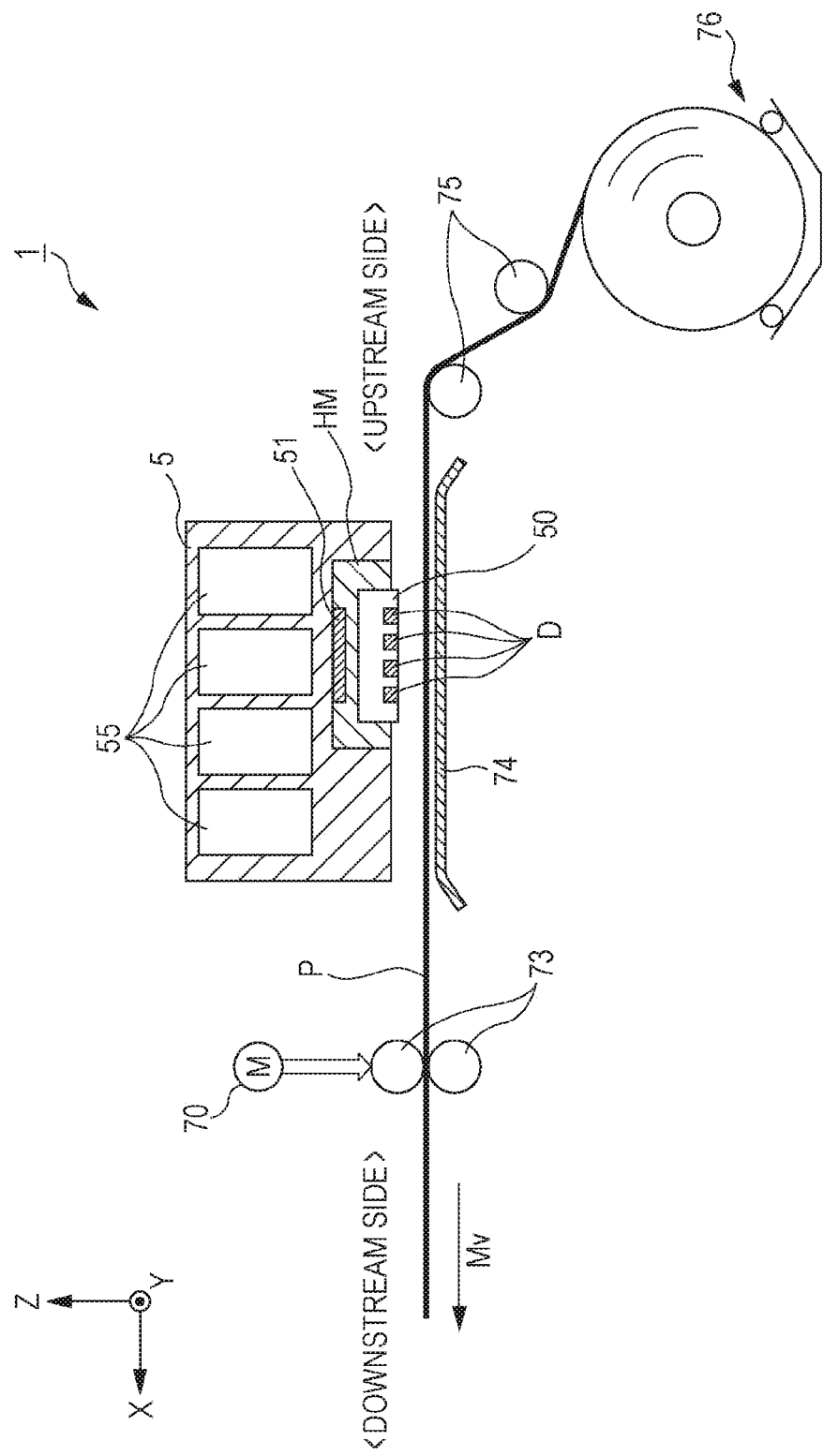
FIG. 2 is a cross-sectional view illustrating an example of a schematic inner structure of the printing apparatus.

FIG. 2 is a partial cross-sectional view exemplifying a schematic inner configuration of the ink jet printer 1. As illustrated in FIG. 2, it is assumed that the ink jet printer 1 includes four ink cartridges 55. FIG. 2 exemplifies the case where the ink cartridges 55 are included in the printing unit 5, but the ink cartridges 55 may be located at other positions in the ink jet printer 1.

The four ink cartridges 55 are provided for four colors, cyan, magenta, yellow, and black (CMYK), respectively. Ink of the colors corresponding to the ink cartridges 55 is filled in the ink cartridges 55.

As illustrated in FIG. 2, the transporting unit 7 includes a transport motor 70 serving as a driving source for transporting the recording medium P, a platen 74 installed on the lower side (negative direction on a Z axis in FIG. 2) of the printing unit 5, transport rollers 73 that rotate based on an operation of the transport motor 70, guide rollers 75 rotatably arranged around a Y axis illustrated in FIG. 2, and a storage section 76 for storing the recording medium P wound in a rolled state.

When the ink jet printer 1 executes the printing process, the transporting unit 7 transports the recording medium P from the storage section 76 in a positive direction (which is from an upstream side to a downstream side and hereinafter referred to as "transport direction Mv" in some cases) on an X axis in FIG. 2 along a transport path defined by the guide rollers 75, the platen 74, and the transport rollers 73. Hereinafter, as illustrated in FIG. 2, the positive direction (transport direction Mv) on the X axis, and a negative direction on the X axis that is opposite to the positive direction on the X axis, are collectively referred to as X axis direction; a positive direction (upward direction) on the Z axis, and a negative direction (downward direction) on the Z axis that is opposite to the positive direction on the Z axis, are collectively referred to as Z axis direction; and a positive direction on the Y axis that intersects the X axis direction and the Z axis direction, and a negative direction on the Y axis that is opposite to the positive direction on the Y axis, are collectively referred to as Y axis direction.

FIG. 2 exemplifies the case where the recording medium P is a roll of paper, but the recording medium P may be rectangular sheets P of, for example, an A4 size or the like.

In this case, the transporting unit 7 may operate to intermittently feed the recording sheets P to the platen 74 one by one.

Each of the number 4×M of discharging sections D included in the printing unit 5 receives ink from any of the four ink cartridges 55. The discharging sections D can hold therein ink supplied from the ink cartridges 55 and discharge the ink from nozzles N (refer to FIG. 3) included in the discharging sections D. Specifically, the discharging sections D discharge the ink onto the recording medium P and form dots making up an image on the recording medium P when the transporting unit 7 transports the recording medium P to the platen 74. Full-color printing is achieved by discharging the ink of the four colors CMYK onto an entire printing region from the number 4×M of discharging sections D of the four printing modules HM included in the printing unit 5.

Next, the print heads 50 and the discharging sections D included in the printing heads 50 are described.

Figure 3:
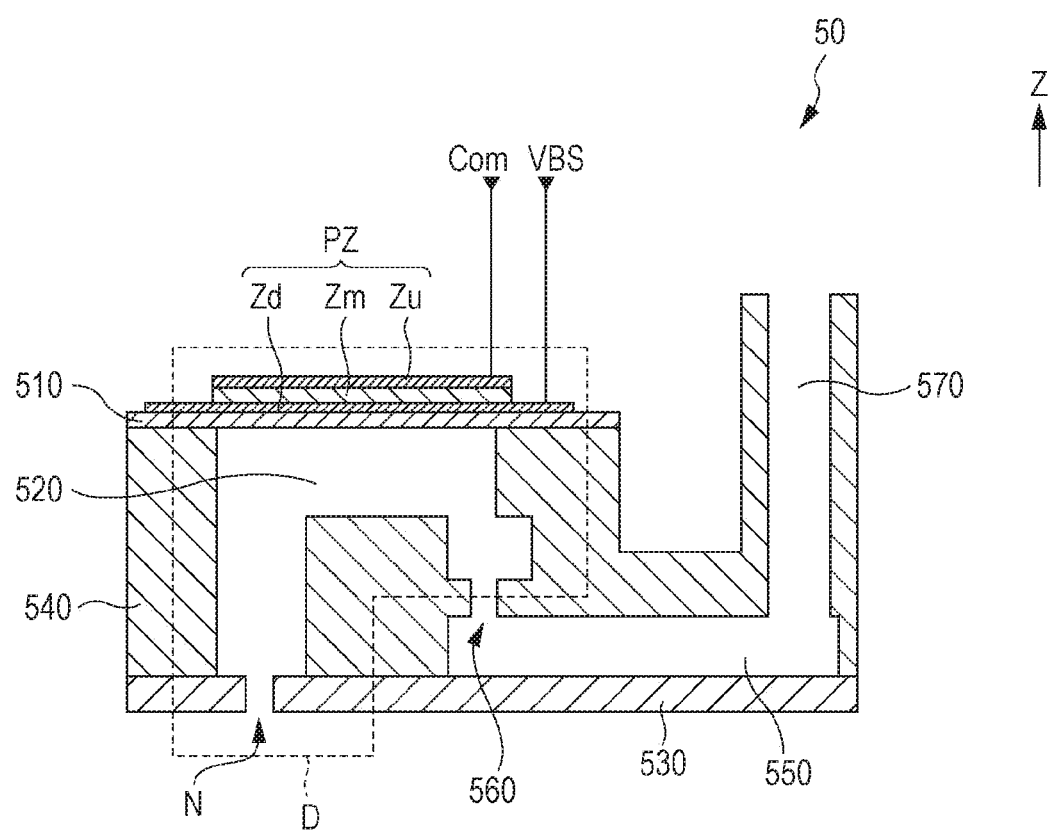
FIG. 3 is a diagram describing an example of the structure of each of discharging sections.

FIG. 3 is a schematic partial cross-sectional view of a print head 50 drawn in such a manner that the print head 50 includes discharging sections D.

As illustrated in FIG. 3, each of the discharging sections D includes a piezoelectric element PZ, a cavity 520 in which ink is filled, a nozzle N communicating with the cavity 520, and a vibrating plate 510.

The cavity 520 is a space sectioned by a cavity plate 540, a nozzle plate 530 in which the nozzle N is formed, and the vibrating plate 510. The cavity 520 communicates with a reservoir 550 via an ink supply port 560. The reservoir 550 communicates with an ink cartridge 55 corresponding to the target discharging section D via an ink intake port 570.

The piezoelectric element PZ includes an upper electrode Zu, a lower electrode Zd, and a piezoelectric body Zm located between the upper electrode Zu and the lower electrode Zd. When a voltage is applied between the upper electrode Zu and the lower electrode Zd by setting the lower electrode Zd to a potential VBS as described later and supplying a driving signal Com to the upper electrode Zu, the piezoelectric element PZ is displaced in the positive direction on the Z axis or the negative direction on the Z axis based on the applied voltage. In the ink jet printer 1, as the piezoelectric element PZ, a unimorph (monomorph) piezoelectric element is used as illustrated in FIG. 3. The piezoelectric element PZ is not limited to the unimorph piezoelectric element and may be a bimorph piezoelectric element, a multilayer piezoelectric element, or the like.

The vibrating plate 510 is installed on an upper opening portion of the cavity plate 540. The lower electrode Zd is bonded to the vibrating plate 540. Thus, when the piezoelectric element PZ is driven and displaced by the driving signal Com, the vibrating plate 510 is also displaced. Then, the capacity of the cavity 520 changes due to the displacement of the vibrating plate 510 and the ink filled in the cavity 520 is discharged from the nozzle N. When the amount of the ink within the cavity 520 is reduced due to the discharge of the ink, ink is supplied from the reservoir 550 into the cavity 520.

Figure 4:
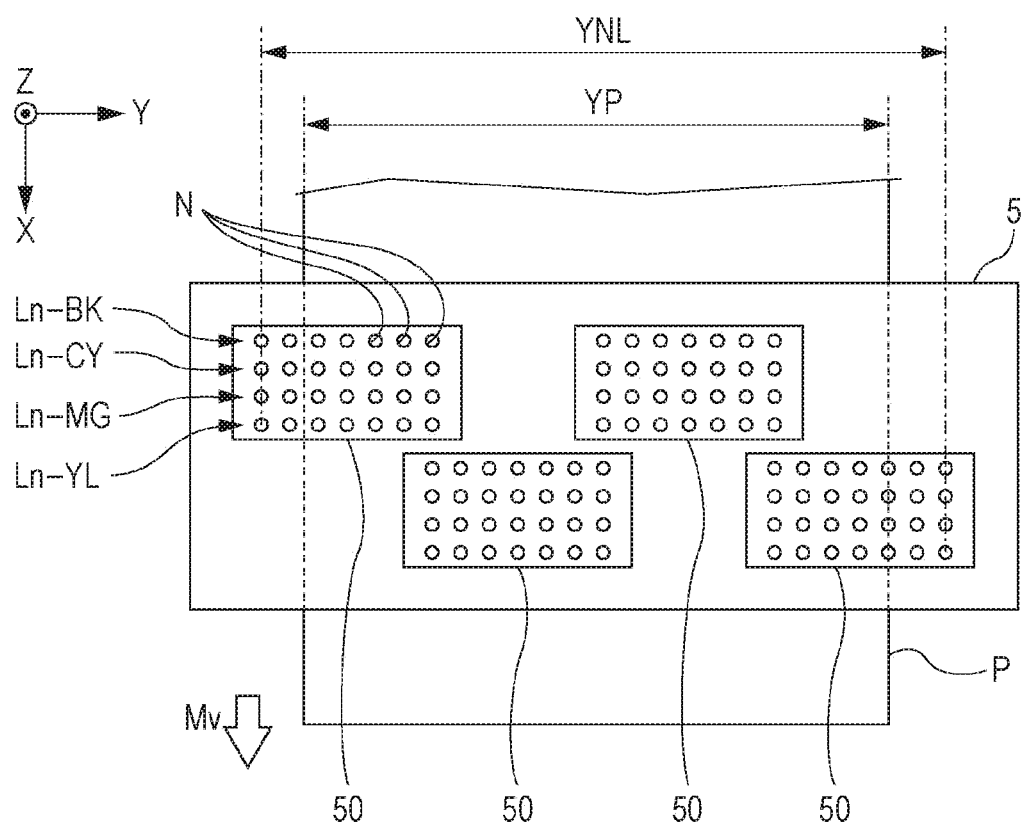
FIG. 4 is a plan view illustrating an example of the arrangement of nozzles included in a printing unit.

FIG. 4 is a diagram illustrating an example of the arrangement of the nozzles N and specifically illustrating an example of the arrangement of the four print heads 50 included in the printing unit 5 and an example of the arrangement of the number 4×M of nozzles N included in the four print heads 50 when the ink jet printer 1 is viewed in plan view from the positive direction on the Z axis.

As illustrated in FIG. 4, each of the print heads 50 included in the printing unit 5 includes nozzle strings Ln. Each of the nozzle strings Ln includes multiple nozzles N arranged in a predetermined direction. It is assumed that, in the ink jet printer 1, each of the print heads 50 includes four nozzle strings Ln, a nozzle string Ln-Bk, a nozzle string Ln-CY, a nozzle string Ln-MG, and a nozzle string Ln-YL as an example. Nozzles N that belong to the nozzle strings Ln-BK are included in discharging sections D for discharging black ink. Nozzles N that belong to the nozzle strings Ln-CY are included in discharging sections D for discharging cyan ink. Nozzles N that belong to the nozzle strings Ln-MG are included in discharging sections D for discharging magenta ink. Nozzles N that belong to the nozzle strings Ln-YL are included in discharging sections D for discharging yellow ink. In addition, it is assumed that, in the ink jet printer 1, four nozzle strings Ln included in each of the print heads 50 extend in the Y axis direction when viewed in plan view as an example.

As illustrated in FIG. 4, the printing unit 5 included in the ink jet printer 1 is a line head. Specifically, when the ink jet printer 1 executes the printing process on the recording medium P (specifically, recording medium P having a width extending in the Y axis direction and equal to the maximum width printable by the ink jet printer 1), an arrangement range YNL of the number 4×M of nozzles N included in the printing unit 5 in the Y axis direction includes a range YP of the recording medium P in the Y axis direction.

It is assumed that, in the ink jet printer 1, the range YP is equal to or larger than 297 millimeters as an example. In other words, the line head (printing unit 5) included in the ink jet printer 1 has a size in the Y axis direction in such a manner that the line head (printing unit 5) executes printing on an A4 size recording sheet P having longer sides extending in the Y axis direction. The nozzles N are arranged in the printing unit 5 included in the ink jet printer 1 in such a manner that the printing unit 5 can form dots at densities of 2400 dpi or more×600 dpi or more. The ink jet printer 1 can execute the printing process at a certain printing speed to form 20 or more images of the A4 size per minute.

The arrangement, illustrated in FIG. 4, of the four print heads 50 included in the printing unit 3 and the arrangement, illustrated in FIG. 4, of the nozzle strings Ln of the print heads 50 are examples. In the printing unit 5, the arrangement of the print heads 50 and the arrangement of the nozzle strings Ln are arbitrary.

For example, although the nozzle strings Ln extend in the Y axis direction in FIG. 4, the nozzle strings Ln may extend in an arbitrary direction in an XY plane. The nozzle strings Ln may extend in an oblique direction different from the X and Y axis directions in the XY plane.

In addition, although each of the print heads 50 includes four nozzle strings Ln in FIG. 4, it is sufficient if each of the print heads 50 includes one or more nozzle strings Ln.

Furthermore, multiple nozzles N included in each of the nozzle strings Ln are arranged in a single row in the Y axis direction in FIG. 4, but may be arranged in a zigzag manner in such a manner that the positions, in the X axis direction, of even-numbered nozzles N from the negative direction on the Y axis are different from the positions, in the X axis direction, of odd-numbered nozzles from the negative direction on the Y axis in FIG. 4.

Next, the power supply unit 9 is described.

Figure 5:
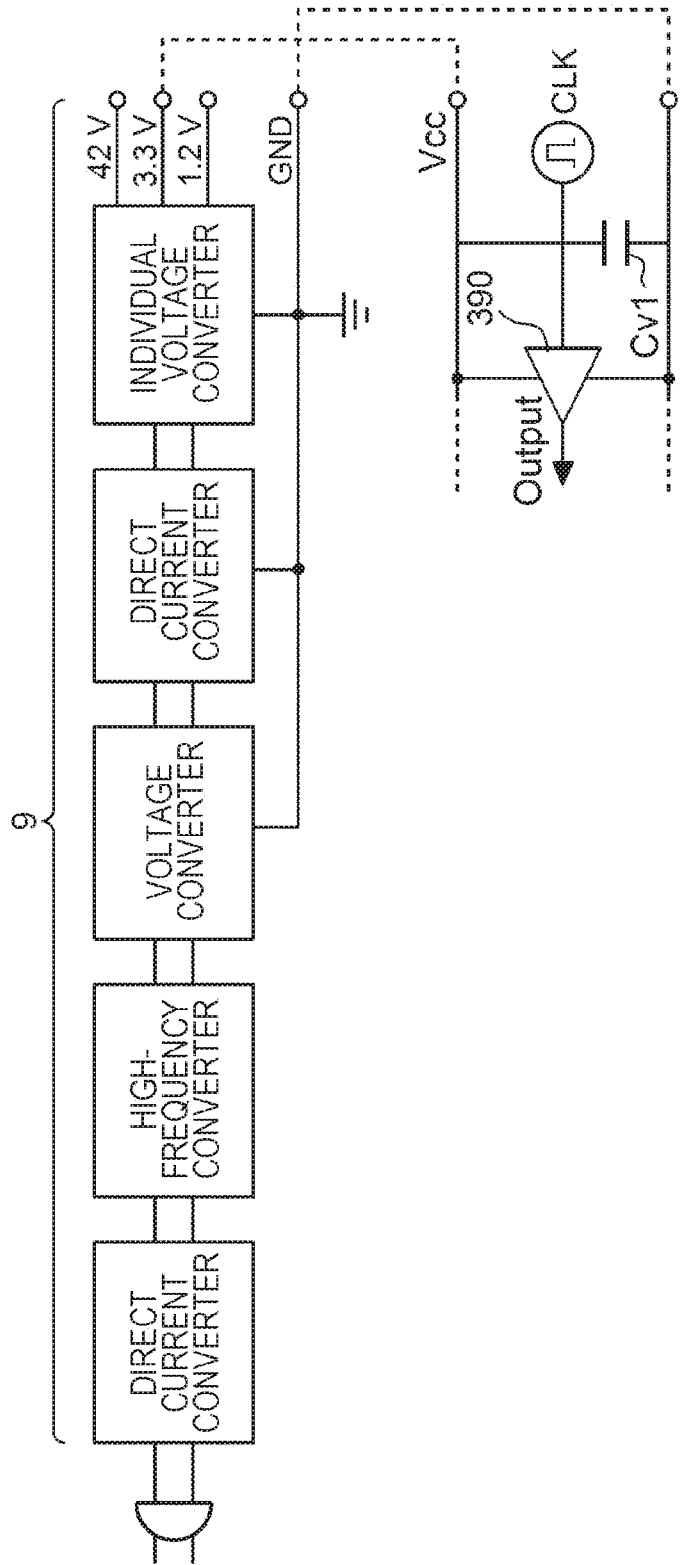
FIG. 5 is a diagram illustrating an example of the configuration of a power supply unit.

FIG. 5 is a circuit diagram of the power supply unit 9.

As illustrated in FIG. 5, the power supply unit 9 converts a commercial voltage received at a downstream stage to a direct-current voltage, uses a semiconductor element or the like to convert the direct-current voltage to a high-frequency alternating voltage corresponding to power equal to or higher than commercial power, uses a transformer or the like to convert the alternating voltage to a middle voltage at a stage located on the downstream side with respect to the semiconductor element or the like, rectifies the middle voltage to generate individual voltages to be used for the functions of the ink jet printer 1.

A ground (GND) terminal is among output terminals included in the power supply unit 9 and is located on a low-voltage side (ground side) of the power supply unit 9, and terminals that are among output terminals included in the power supply unit 9 and are located on a high-voltage side of the power supply unit 9 are a 42V terminal for driving the piezoelectric elements PZ, a 3.3V terminal serving as a power source of general IC components, and a 1.2V terminal for supplying a core voltage to the CPU and the like, for example.

The power supply unit 9 supplies power Pw to each of the operating units of the ink jet printer 1 as described above. FIG. 5 illustrates a buffer 390 as an example of an integrated circuit (IC) composed of the operating units. The buffer 390 buffers a clock signal CLK serving as a pulse signal while serving as a power supply between the ground GND and a Vcc terminal connected via the 3.3V terminal and serving as a power supply terminal, and outputs the clock signal CLK from an output terminal Output of the buffer 390. Details of a capacitor Cv1 are described later.

Next, configurations of the printing modules HM are described.

Figure 6:
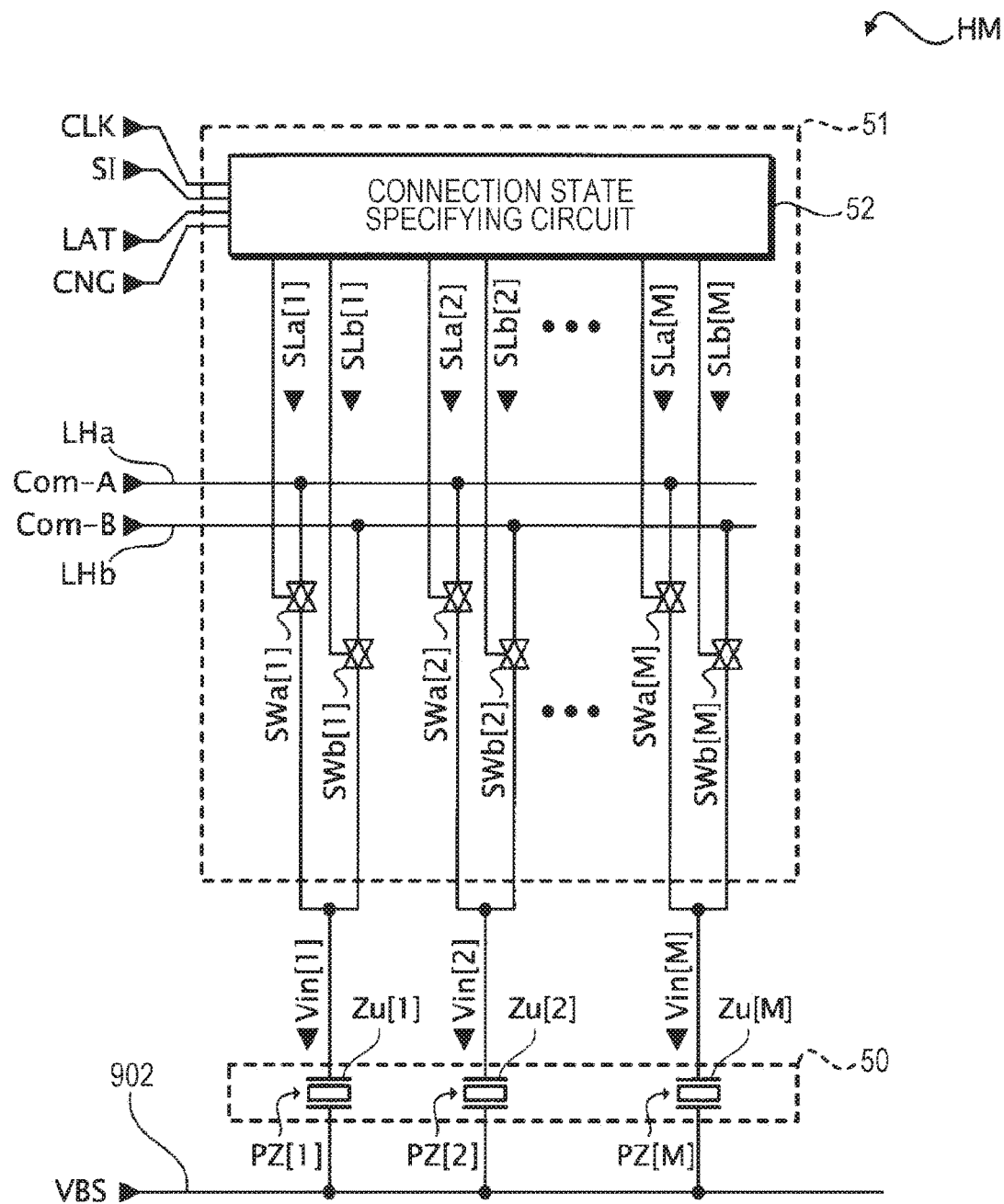
FIG. 6 is a block diagram illustrating an example of the configuration of each of printing modules.

FIG. 6 is a block diagram illustrating an example of the configuration of each of the printing modules HM. As described above, each of the printing modules HM includes a print head 50 and a driving signal supply circuit 51. Each of the printing modules HM also includes an internal wiring LHa through which a driving signal Com-A is supplied from the driving signal generating unit 4 and an internal wiring LHb through which a driving signal Com-B is supplied from the driving signal generating unit 4. In addition, a power supply line 902 set to a potential VBS is connected to the common electrodes (lower electrodes Zd illustrated in FIG. 3) of the piezoelectric elements PZ[1] to PZ[M] included in the printing head 50.

As illustrated in FIG. 6, the driving signal supply circuit 51 includes a number M of switches SWa (SWa[1] to SWa[M]), a number M of switches SWb (SWb[1] to SWb[M]), and a connection state specifying circuit 52 that specifies connection states of the switches. As the switches, transmission gates may be used, for example.

The connection state specifying circuit 52 generates, based on a printing signal SI, a latch signal AT, and a change signal CNG that have been supplied from the print controller 61, connection state specifying signals SLa[1] to Sla[M] for specifying on and off states of the switches SWa[1] to SWa[M] and connection state specifying signals SLb[1] to Slb[M] for specifying on and off states of the switches SWb[1] to SWb[M].

A switch SWa[m] switches, based on a connection state specifying signal SLa[m], conduction and non-conduction between an internal wiring LHa and an upper electrode Zu of [m] of a piezoelectric element PZ[m] included in a discharging section D[m]. As an example, the embodiment assumes that the switch SWa[m] is turned on when the connection state specifying signal Sla[m] is at a high level and that the switch SWa[m] is turned off when the connection state specifying signal Sla[m] is at a low level.

A switch SWb[m] switches, based on a connection state specifying signal SLb[m], conduction and non-conduction between an internal wiring LHb and an upper electrode Zu of [m] of a piezoelectric element PZ[m] included in a discharging section D[m]. In the embodiment, as an example, the embodiment assumes that the switch SWb[m] is turned on when the connection state specifying signal Slb[m] is at a high level and that the switch SWb[m] is turned off when the connection state specifying signal Slb[m] is at a low level.

A signal that is either a driving signal Com-A or a driving signal Com-B and is supplied to a piezoelectric element PZ[m] of a discharging section D[m] via a switch SWa[m] or a switch SWb[m] is referred to as supply driving signal Vin[m] in some cases.

Figures 7, 8:
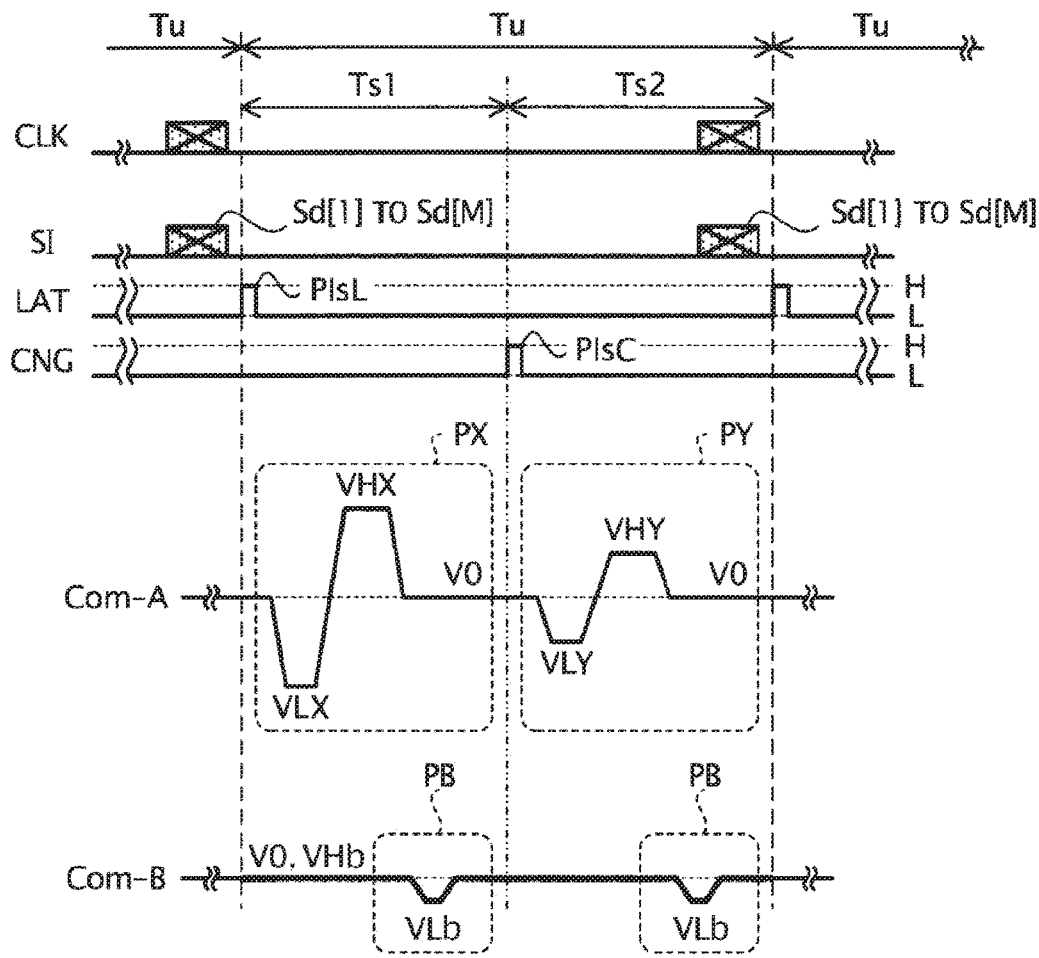
FIG. 7 is a timing chart describing an example of a printing process.
FIG. 8 is a diagram describing an example of relationships between a printing signal and connection state specifying signals.
Figure 9:
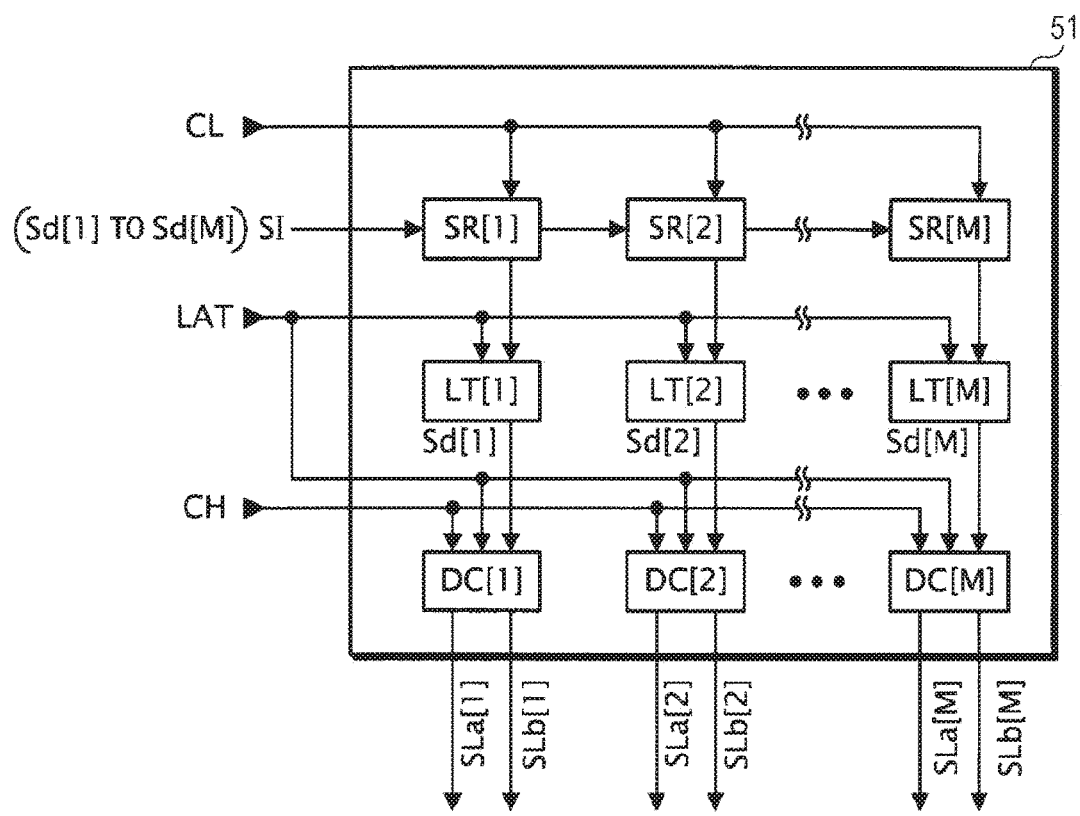
FIG. 9 is a block diagram illustrating an example of the configuration of each of driving signal supply circuits.

FIGS. 7 to 9 are diagrams describing operations of the printing modules HM.

As illustrated in FIG. 7, an operational time period of the ink jet printer 1 includes one or multiple unit time periods Tu. The ink jet printer 1 can execute the printing process within each of the unit time periods Tu. Specifically, the ink jet printer 1 can execute a process of driving the discharging sections D and causing the discharging sections D to discharge ink in the printing process within each of the unit time periods Tu. Then, the ink jet printer 1 forms the image indicated in the printing data Img by repeatedly executing the printing process within continuous or intermittent multiple unit time periods Tu and causing each of the discharging sections D to discharge ink one or multiple times, for example.

FIG. 7 is a timing chart of an example of operations of the ink jet printer 1 in a unit time period Tu. As illustrated in 7, the print controller 61 outputs the latch signal LAT having a pulse PlsL and the change signal CNG having a pulse PlsC. Thus, the print controller 61 defines each of the unit time periods Tu as a time period from a rise of the pulse PlsL to the next rise of the pulse PlsL. In addition, the print controller 61 divides each of the unit time periods Tu into two control time periods Ts1 and Ts2 based on the pulse PlsC.

A printing signal SI includes individual specifying signals Sd[1] to Sd[M] specifying driving states of the discharging sections D[1] to D[M] in each of the unit time periods Tu. As illustrated in FIG. 7, when the printing process is executed within the target unit time period Tu, the print controller 61 synchronizes the printing signal SI including the individual specifying signals Sd[1] to Sd[M] with a clock signal CLK and supplies the printing signal SI and the clock signal CLK to a connection state specifying circuit 52 before the start of the target unit time period. In this case, the connection state specifying circuit 52 generates connection state specifying signals SLa[m] and SLb[m] based on an individual specifying signal Sd[m] within the target unit time period Tu.

As illustrated in FIG. 7, a driving signal generating circuit 40 outputs a driving signal Com-A having a waveform PX in a control time period Ts1 and a waveform PY in a control time period Ts2. In the embodiment, the waveforms PX and PY are determined in such a manner that the difference between the highest potential VHX of the waveform PX and the lowest potential VLX of the waveform PX is larger than the difference between the highest potential VHY of the waveform PY and the lowest potential VLY of the waveform PY. Specifically, in the case where the discharging section D[m] is driven by the driving signal Com-A having the waveform PX, the waveform PX is determined in such a manner that ink in an amount (middle amount) corresponding to a middle dot is discharged from the discharging section D[m]. In the case where the discharging section D[m] is driven by the driving signal Com-A having the waveform PY, the waveform PY is determined in such a manner that ink in an amount (small amount) corresponding to a small dot is discharged from the discharging section D[m]. Potentials of the waveforms PX and PY upon the start and end of the unit time period Tu are set to a standard potential V0.

In addition, the driving signal generating circuit 40 outputs a driving signal Com-B having two waveforms PB in the control time periods Tel and Ts2. In the embodiment, the waveforms PB are determined in such a manner that the difference between the highest potential VHb of the waveforms PB and the lowest potential VLb of the waveforms PB is smaller than the difference between the highest potential VHY of the waveform PY and the lowest potential VLY of the waveform PY. Specifically, in the case where the discharging section DM is driven by the driving signal Com-B having the waveforms PB, the waveforms PB are determined in such a manner that the discharging section D[m] is driven and does not discharge ink. Potentials of the waveforms PB upon the start and end of the unit time period Tu are set to the standard potential V0. The embodiment assumes that the highest potential VHb is equal to the standard potential V0.

FIG. 8 is a diagram describing an example of relationships between the individual specifying signal Sd[m] and the connection state specifying signals SLa[m] and SLb[m] in the unit time period Tu.

It is assumed that the individual specifying signal Sd[m] is a 2-bit digital signal. Specifically, in each of the unit time periods Tu, the individual specifying signal Sd[m] is set to any of a value (1, 1) specifying the discharge (hereinafter also referred to as "large dot formation") of ink in an amount (large amount) corresponding to a large dot for the discharging section D[m], a value (1, 0) specifying the discharge (hereinafter also referred to as "middle dot formation") of ink in an amount (middle amount) corresponding to a middle dot for the discharging section D[m], a value (0, 1) specifying the discharge (hereinafter also referred to as "small dot formation") of ink in an amount (small amount) corresponding to a small dot for the discharging section DM, and a value (0, 0) specifying non-discharge of ink for the discharging section D[m].

If the individual specifying signal Sd[m] is set to the value (1, 1) specifying the large dot formation, the connection state specifying circuit 52 sets the connection state specifying signal SLa(m) to the high level in the control time periods Ts1 and Ts2 and sets the connection state specifying signal SLb(m) to the low level in the control time periods Ts1 and Ts2. In this case, the discharging section D[m] is driven by the driving signal Com-A having the waveform PX to discharge a middle amount of ink in the control time period Ts1 and is driven by the driving signal Com-A having the waveform PY to discharge a small amount of ink in the control time period Ts2. Thus, the discharging section D[m] totally discharges a large amount of ink in the unit time period Tu and forms a large dot on the recording medium P.

If the individual specifying signal Sd[m] is set to the value (1.0) specifying the middle dot formation, the connection state specifying circuit 52 sets the connection state specifying signal SLa(m) to the high level in the control time period Ts1 and to the low level in the control time period Ts2 and sets the connection state specifying signal SLb(m) to the low level in the control time period Ts1 and to the high level in the control time period Ts2. In this case, the discharging section D[m] totally discharges a middle amount of ink in the unit time period Tu and forms a middle dot on the recording medium P.

If the individual specifying signal Sd[m] is set to the value (0.1) specifying the small dot formation, the connection state specifying circuit 52 sets the connection state specifying signal SLa(m) to the low level in the control time period Te1 and to the high level in the control time period Ts2 and sets the connection state specifying signal SLb(m) to the high level in the control time period Ts1 and to the low level in the control time period Ts2. In this case, the discharging section D[m] totally discharges a small amount of ink in the unit time period Tu and forms a small dot on the recording medium P.

If the individual specifying signal Sd[m] is set to the value (0.0) specifying the non-discharge of ink, the connection state specifying circuit 52 sets the connection state specifying signal SLa[m] to the low level in the control time periods Ts1 and Ts2 and sets the connection state specifying signal SLb[m] to the high level in the control time periods Ts' and Ts2. In this case, the discharging section D[m] does not discharge ink in the unit time period Tu and does not form a dot on the recording medium P.

FIG. 9 is a diagram illustrating an example of the configuration of each of the connection state specifying circuits 52. As illustrated in FIG. 9, the connection state specifying circuit 52 generates connection state specifying signals SLa[1] to SLa[M] and connection state specifying signals SLb[1] to SLb[M].

Specifically, the connection state specifying circuit 52 includes transferring circuits SR[1] to SR[M], latch circuits LT[1] to LT[M], and decoders DC[1] to DC[M]. The transferring circuits SR[1] to SR[M] correspond to the discharging sections D[1] to D[M], respectively. The latch circuits LT[1] to LT[M] correspond to the discharging sections D[1] to D[M], respectively. The decoders DC[1] to DC [M] correspond to the discharging sections D [1] to D[M], respectively. An individual specifying signal Sd[m] is supplied to a transferring circuit SR[m] among the transferring circuits SR[1] to SR[M]. FIG. 9 exemplifies the case where the individual specifying signals Sd[1] to Sd[M] are serially supplied. For example, FIG. 9 exemplifies the case where the individual specifying signal Sd[m] corresponding to an m-th stage is transferred from the transferring circuit SR[1] to the transferring circuit SR[m] while being synchronized with the clock signal CLK. In addition, a latch circuit LT[m] latches the individual specifying signal Sd[m] supplied to the transferring circuit SR[m] when the pulse PlsL of the latch signal LAT rises to a high level. Furthermore, a decoder DC[m] generates connection state specifying signals SLa[m] and SLb[m] based on the individual specifying signal Sd[m], the latch signal LAT, and the change signal CH in accordance with details illustrated in FIG. 8.

Next, the capacitor Cv1 illustrated in FIG. 5 and a region located close to the capacitor Cv1 and included in a circuit substrate on which the capacitor Cv1 is mounted are described.

In FIG. 5, the buffer 390 receives a current from a power line for each of repetitive cycles of the clock signal CLK. Thus, the current in the power line between the 3.3V terminal and the Vcc terminal rapidly fluctuates based on an operation of the buffer 390, and a voltage drop (ripple) occurs in the power line in response to the rapid fluctuation.

In FIG. 5, the capacitor Cv1 is connected between the power line and the ground GND in order to suppress such a ripple. If a ripple occurs, electric charges stored in the capacitor Cv1 are supplied in order to stabilize currents and voltages to be supplied to the buffer 390 and the like.

A ripple of the Vcc terminal may be a source of noise in the power line and may cause a problem, such as unnecessary radiation, with electromagnetic compatibility (EMC) in the ink jet printer 1. The capacitor Cv1, however, addresses the problem with the EMC. Since the capacitor Cv1 functions as described above, the capacitor Cv1 is referred to as a decoupling capacitor or bypass capacitor.

Although it is preferable that the capacitance of the decoupling capacitor be sufficiently large, a capacitor with a capacitance of 0.1 µF may be used as the decoupling capacitor based on experiments in many cases. Regarding the shape of the decoupling capacitor, a chip-type (small rectangular parallelepiped) capacitor that includes two terminals and has a length of 1 millimeter (mm) between the two terminals and a width of 0.5 mm may be used as the decoupling capacitor in general (this shape is referred to as 1005 size).

Figure 10:
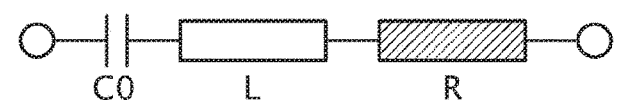
FIG. 10 is a diagram illustrating a circuit equivalent with a capacitor.

FIG. 10 is a diagram illustrating a circuit equivalent with the chip-type capacitor.

A general capacitor including such a chip-type capacitor has a main capacitance value C0, a resistance (R) component, and an inductance (L) component. The capacitor has a self-resonant frequency (F) indicated by the following Equation (1) due to the L component.

$$F=1/(2\pi\sqrt{(C0*L)}) \quad (1)$$

It is preferable that the L component of the decoupling capacitor be small. If the L component is small, the self-resonant frequency can be high based on Equation (1), and impedance between the two terminals of the decoupling capacitor in a frequency band equal to or higher than the self-resonant frequency can be low.

In a frequency band lower than the self-resonant frequency, the decoupling capacitor has an original capacitive property and supplies electric charges in response to a voltage ripple at the Vcc terminal to stabilize a high-voltage-side voltage (of 3.3 volts in this example). On the other hand, in a frequency band equal to or higher than the self-resonant frequency, the decoupling capacitor has an inductive property, and the impedance between the two terminals increases in proportion to the frequency of the voltage. If the L component is small, the increase in the impedance between the two terminals is reduced and a voltage component (source of noise) in a high frequency band is reduced. Thus, the amount of the high-frequency band noise flowing from the Vcc terminal to the power line is reduced.

The L component of the chip-type capacitor depends on the shape of the capacitor and does not affect substantially the capacitance value C0 of the chip-type capacitor. For example, in the chip-type capacitor having the aforementioned 1005 size, the L component is almost fixed to approximately 0.37 nH regardless of the capacitance value. As a method of reducing an effect of the L component, multiple capacitors having the 1005 size are connected in parallel and used as the decoupling capacitor. For example, if two chip-type capacitors are connected in parallel, the chip-type capacitors serve as two equivalent circuits illustrated in FIG. 10, and an inductance component of the capacitors connected in parallel is reduced by approximately half based on calculation.

Figure 11:
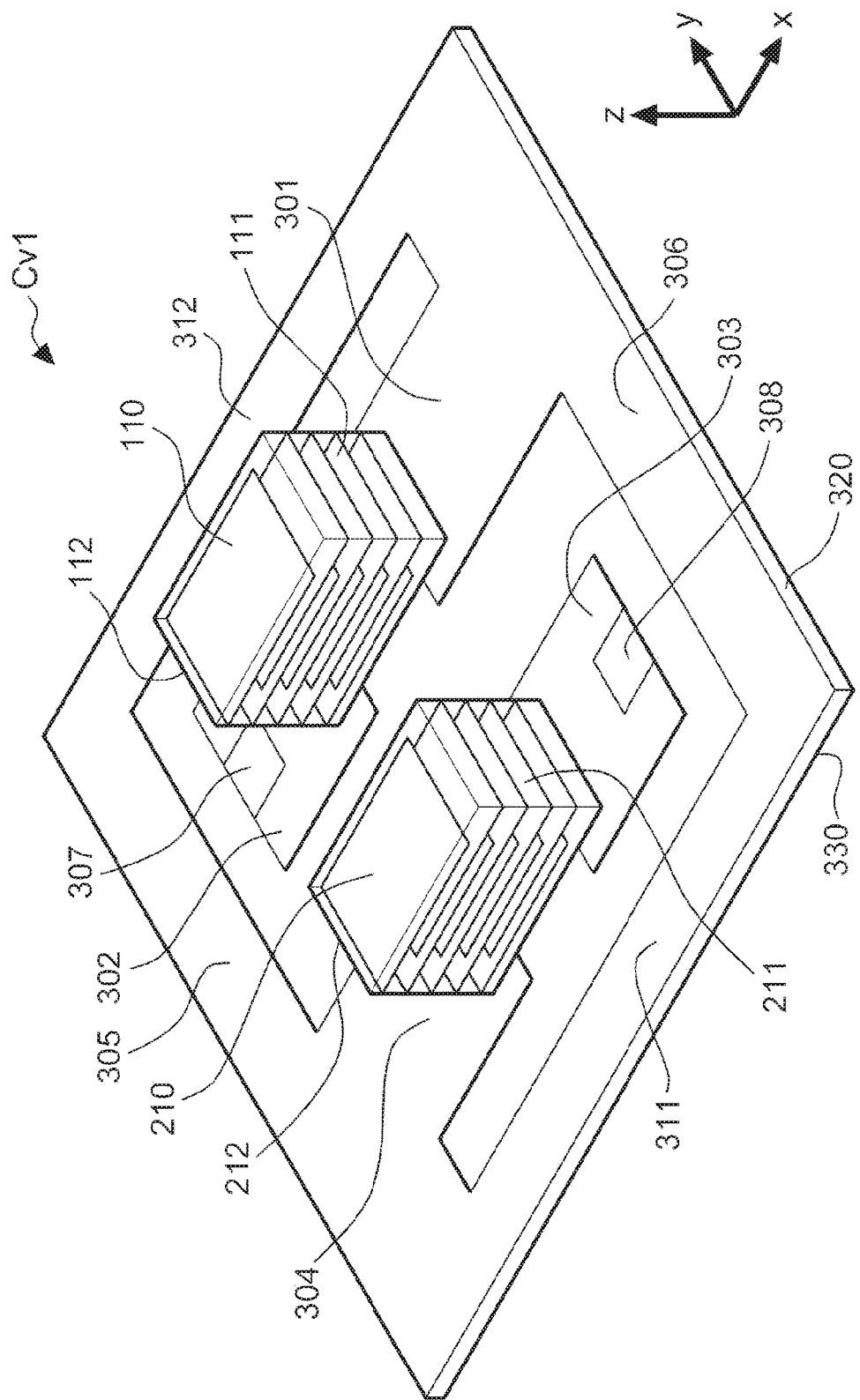
FIG. 11 is a diagram illustrating a part of a circuit substrate included in the power supply unit.

FIG. 11 is a diagram illustrating a preferable example of the capacitor Cv1 serving as the decoupling capacitor applied to the ink jet printer 1. The capacitor Cv1 according to this example includes two chip-type capacitors 110 and 210 connected in parallel. A feature of the capacitor Cv1 is the arrangement of the two chip-type capacitors 110 and 210. As illustrated in FIG. 11, the chip-type capacitors 110 and 210 are arranged in such a manner that high-frequency currents flow through the two capacitors 110 and 210 toward the side of the ground (GND) in antiparallel directions (that are parallel to each other and in which the high-frequency currents flow in opposite directions).

This arrangement is described below.

FIG. 11 illustrates a portion that is included in the circuit substrate illustrated in FIG. 5 and on which the capacitor Cv1 is mounted.

The circuit substrate is a dielectric substrate 320 and is composed of multiple layers in general. In order to simplify the illustration of the dielectric substrate 320, FIG. 11 illustrates a single dielectric layer included in the dielectric substrate 320, an upper surface on which the capacitor Cv1 is mounted, and a solid-like lower surface serving as a ground (GND) layer 330.

The chip-type capacitor 110 (first capacitor) and the chip-type capacitor 210 (second capacitor) are mounted on the upper surface (surface layer) of the dielectric substrate 320.

The capacitor 110 has a first terminal 111 and a second terminal 112, while the capacitor 210 has a third terminal 211 and a fourth terminal 212. The capacitors 110 and 210 are arranged in such a manner that longitudinal directions of the capacitors 110 and 210 are substantially parallel to each other.

In other words, the capacitors 110 and 210 are arranged in such a manner that a direction in which the first and second terminals 111 and 112 of the capacitor 110 are arranged opposite to each other is substantially parallel to a direction in which the third and fourth terminals 211 and 212 of the capacitor 210 are arranged opposite to each other.

In this arrangement, the first terminal 111 and the third terminal 211 are arranged side by side in a horizontal direction in which the upper surface of the dielectric substrate 320 extends, and the second terminal 112 and the fourth terminal 212 are arranged side by side in the horizontal direction in which the upper surface of the dielectric substrate 320 extends.

A first wiring pattern is formed on the upper surface of the dielectric substrate 320 by patterning a first conductive layer and includes electrodes 301, 302, 303, 304, 305, 306, 311, and 312.

A second conductive layer is formed on the lower surface of the dielectric substrate 320 and serves as the ground (GND) layer 330 (second wiring pattern).

A via electrode 307 and a via electrode 308 are formed in the dielectric substrate 320. The via electrode 307 extends through the dielectric layer of the dielectric substrate 320 and connects the electrode 302 and the ground (GND) layer 330 to each other, while the via electrode 308 extends through the dielectric layer of the dielectric substrate 320 and connects the electrode 303 and the ground (GND) layer 330 to each other.

The second terminal 112 of the capacitor 110 and the third terminal 211 of the capacitor 210 are electrically commonly connected to the ground (GND) layer 330 through vias (contact holes). Specifically, the second terminal 112 of the capacitor 110 is connected to the ground (GND) layer 330 through the electrode 302 and the via electrode 307, while the third terminal 211 of the capacitor 210 is connected to the ground (GND) layer 330 through the electrode 303 and the via electrode 308.

The first terminal 111 of the capacitor 110 is electrically connected to the electrode 301, while the third terminal 211 of the capacitor 210 is electrically connected to the electrode 304.

The electrodes 301 and 304 are electrically connected to the electrodes 305, 306, 311, and 312 electrically connected to the power supply terminal (Vcc) for IC components mounted on the dielectric substrate 320.

Figure 12:
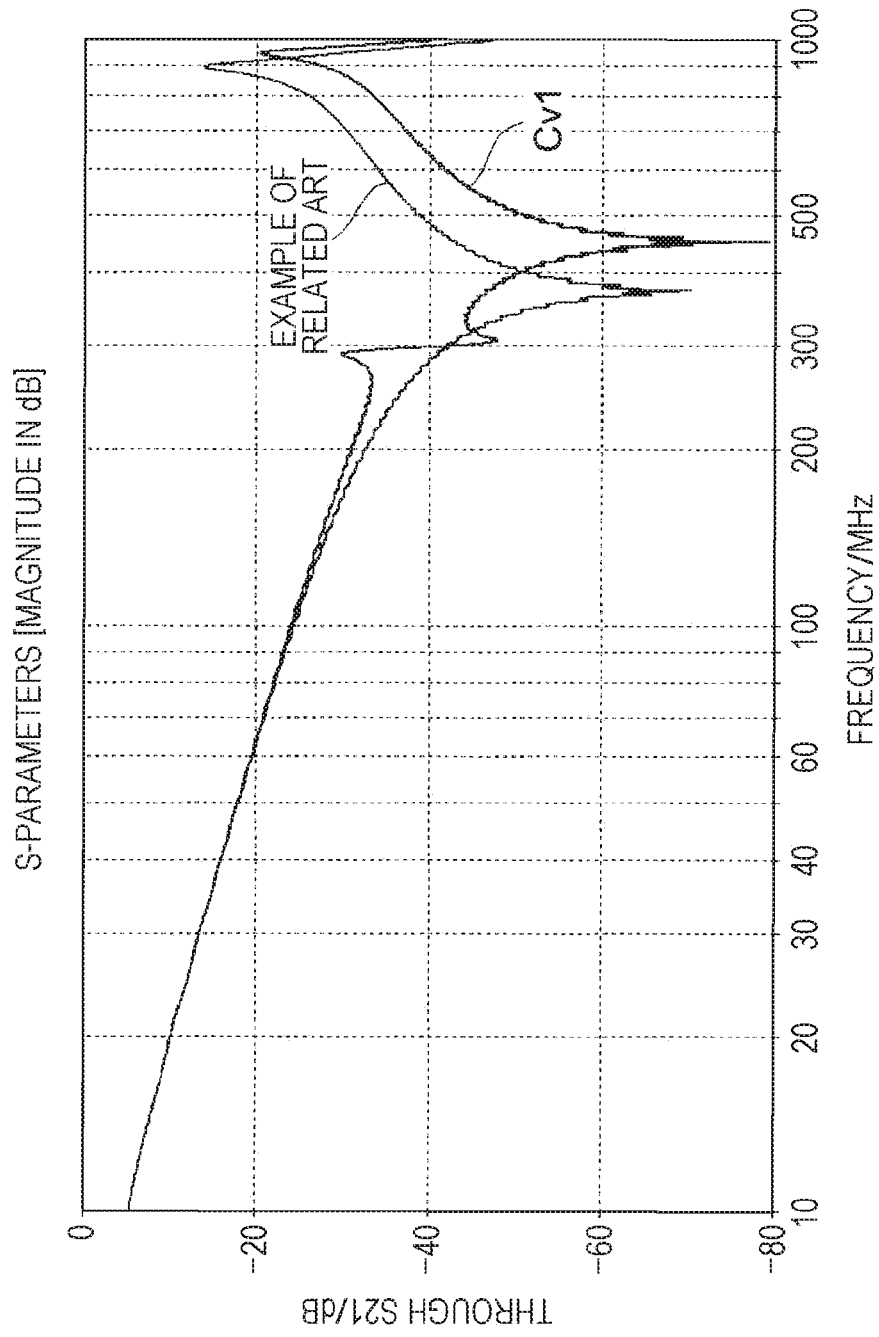
FIG. 12 is a diagram illustrating the comparison of frequency characteristics of the capacitor according to the embodiment with an example of the related art.

FIG. 12 is a diagram illustrating the comparison of frequency characteristics of the capacitor Cv1 with an example of the related art. The frequency characteristics are results of conducting electromagnetical field simulation.

First, before a study using the simulation, the capacitors 110 and 210 of the capacitor Cv1 were shaped to have the 1005 size (1 mm×0.5 mm×0.5 mm) and have the same capacitance. In addition, the dielectric substrate 320 was shaped to have a length of 3.2 mm in a direction between the electrodes 305 and 306, a length of 2.4 mm in a direction between the electrodes 311 and 312, and a thickness of 0.1 mm and have a relative permittivity of 4.2. The via electrodes 307 and 308 have sides of 0.2 mm and are squares in plan view and are connected across the upper and lower surfaces.

The capacitance values of the capacitors 110 and 210 need to be set to approximately 0.1 μF that is a realistic value. Each of the chip-type capacitors, however, actually has 100 or more stacked electrode and dielectric layers. Thus, in consideration of a memory amount consumed by the simulator and time to be taken for the modeling and the calculation, it may be difficult for a simulator used in this study to model and calculate the structures of the actual capacitors.

Thus, in the study, the thickness of each of the dielectric layers was set to 50 micrometers, the relative permittivity was set to 1000, each of the capacitors was of a chip type and had an 8-layer structure, and the capacitance values were set to approximately 500 pF.

The capacitors are basically passive elements and have linear current properties, linear voltage properties, and linear frequency properties. Thus, even if the capacitance values are different from each other, the frequency characteristics of the capacitors tend to be the same as or similar to each other.

In addition, as described above, the L component values of the chip-type capacitors depend on the shapes of the capacitors and are not substantially affected by the capacitance values. Thus, even in the case where the chip-type capacitors having the capacitance values described in this study are used, the capacitors do not largely affect the tendency of a change in the self-resonant frequency.

A capacitor used in the example of the related art and to be compared with the capacitor Cv1 according to the embodiment includes two capacitors connected in parallel. Specifically, the two capacitors of the capacitor used in the example of the related art are arranged in such a manner that high-frequency currents flow in parallel directions and do not flow in antiparallel directions.

Figure 13:
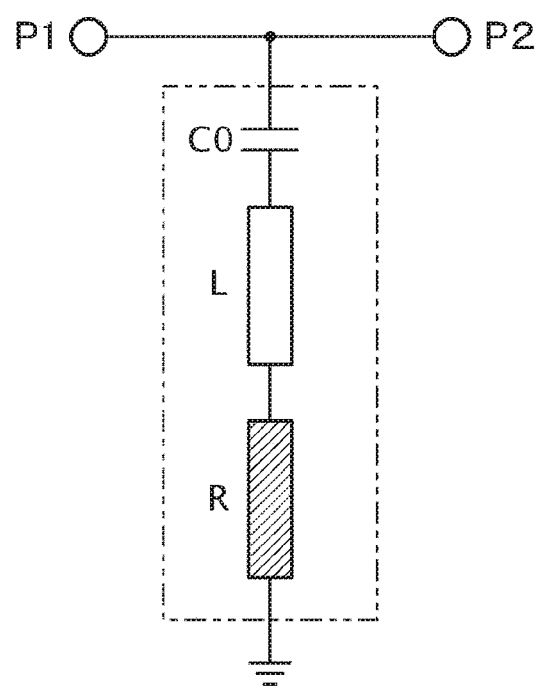
FIG. 13 is a diagram describing a method of evaluating an S parameter of the capacitor.

Frequency characteristics illustrated in FIG. 12 are used for one of methods of evaluating characteristics of the capacitor described with reference to FIG. 10. As illustrated in FIG. 13, the electrode 305 included in the capacitor Cv1 and existing on the side of the Vcc terminal is treated as an input terminal (P1), and the electrode 306 is treated as an output terminal (P2). FIG. 12 illustrates a transmission amount (S21 that is an S parameter) from the input terminal (P1) to the output terminal (P2).

The lowest frequencies indicated by curve lines of S21 is self-resonant frequencies.

In FIG. 12, while the self-resonant frequency of the capacitor used in the example of the related art is 373 MHz, the self-resonant frequency of the capacitor Cv1 according to the embodiment is 455 MHz. It was found that the self-resonant frequency of the capacitor Cv1 according to the embodiment was higher by approximately 22% than the example of the related art.

To compare inductance components (refer to FIGS. 10 and 13) causing the self-resonant frequencies with each other, the inductance component of the decoupling capacitor (according to the embodiment) to be evaluated is indicated by L1, the inductance component of the decoupling capacitor serving as a comparison standard (the example of the related art) is indicated by L0, the self-resonant frequency of the decoupling capacitor (according to the embodiment) to be evaluated is indicated by F1, and the self-resonant frequency of the decoupling capacitor serving as the comparison standard (the example of the related art) is indicated by F0, L1/L0 is expressed by the following Equation (2) using Equation (1).

$$L1/L0=(F0/F1)^2 \quad (2)$$

If Equation (2) is applied and the inductance component of the capacitor used in the example of the related art is "1", the inductance component of the capacitor Cv1 according to the embodiment is 0.67 or smaller by 33% than the inductance component of the capacitor used in the example of the related art.

As described above, a reduction in the inductance component of the capacitor Cv1 according to the embodiment is significantly preferable as EMC measures for the power line at the Vcc terminal of the IC.

When the inductance component of the capacitor 110 and the inductance component of the capacitor 210 are indicated by La, the inductance component of the capacitor used in the example of the related art is approximately La/2. On the other hand, in the embodiment, the high-frequency currents flow from the electrode located on the side of the Vcc terminal through the capacitors 110 and 210 toward the side of the ground (GND) in the antiparallel directions. Due to the high-frequency currents flowing in the antiparallel directions, mutual inductance (M(>0)) of the capacitors 110 and 210 is a negative value. The inductance component Ld of the capacitor Cv1 according to the embodiment is indicated by the following Equation (3).

$$Ld=La/2-M \quad (3)$$

It is apparent from Equation (3) that the inductance component Ld is smaller than the inductance component according to the example of the related art.

The capacitor Cv1 according to the embodiment is applied to the power line on the circuit substrate of the ink jet printer 1. Next, directions in which currents of the power line flow through the capacitor Cv1 were studied.

The directions in which the currents flow were set to an X direction and a Y direction as follows. Specifically, the X direction is a direction in which a current of the power line flows from the side of the electrode 305 to the side of the electrode 306 as described above (or the direction in which the current of the power line flows and that is parallel to the longitudinal directions of the capacitors 110 and 210), while the electrode 306 is treated as an input side and the electrode 305 is treated as an output side. In addition, the Y direction is a direction in which a current of the power line flows from the side of the electrode 311 to the side of the electrode 312 (or the direction in which the current of the power line flows and that is perpendicular to the longitudinal directions of the capacitors 110 and 210), while the electrode 311 is treated as an input side and the electrode 312 is treated as an output side.

Then, transmission amounts (S21 that are S parameters) between the input sides and the output sides in the X and Y directions with respect to frequencies were compared.

The Vcc terminal of the IC to which the power line extends may serve as a noise source. It is considered that transmission amounts (S12 indicating reversed transmission) of the capacitor Cv1 in directions opposite to the directions in which the current of the power line flows need to be studied. However, the capacitor Cv1 is a passive circuit component, and S21 and S12 are S parameters and equal to each other. Thus, there is not any problem to study EMC measures against power source noise of the IC in a study of S21 or the S parameters.

Figure 14:
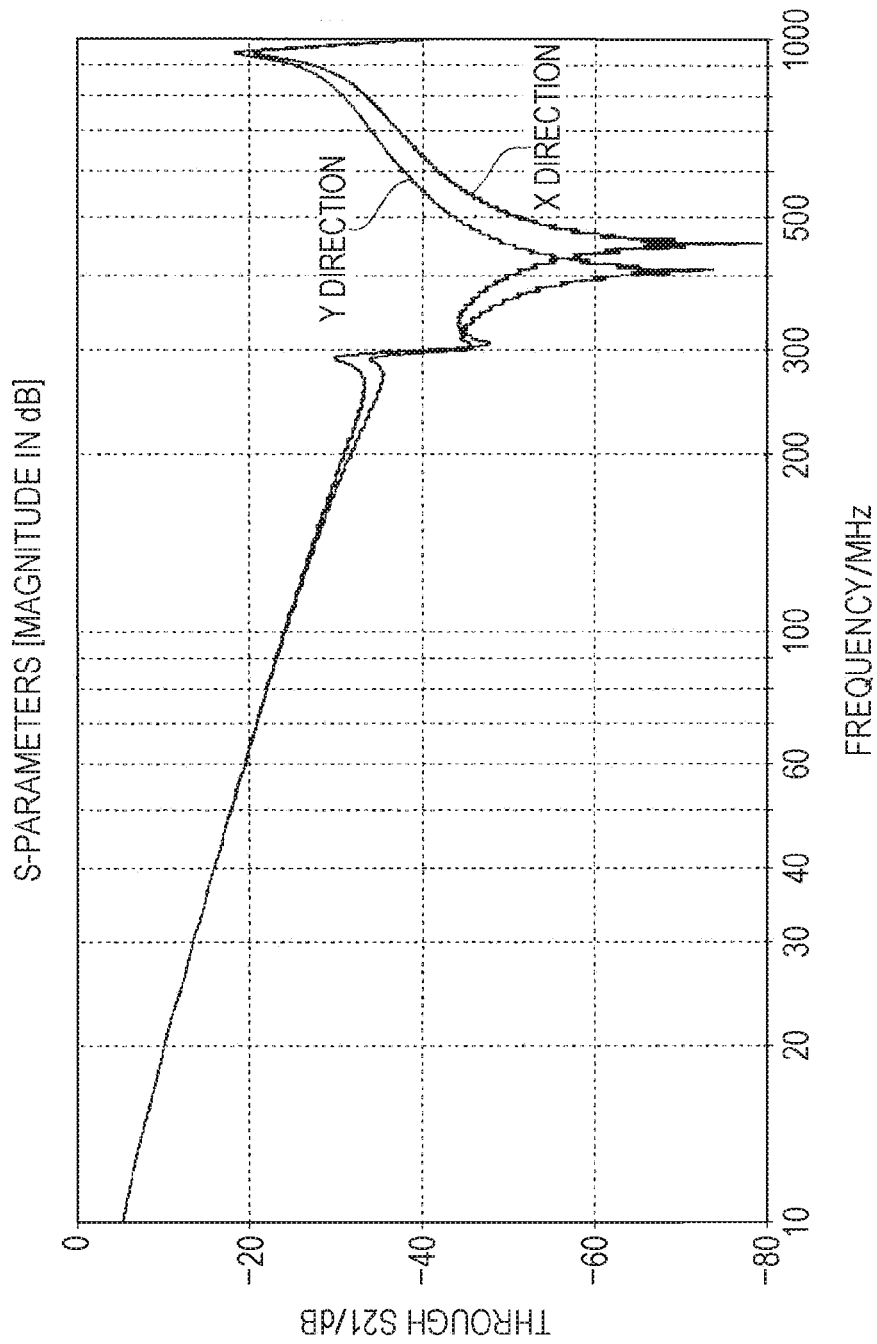
FIG. 14 is a diagram illustrating frequency characteristics of the capacitor with respect to different current directions.

FIG. 14 is a diagram illustrating the results of the study.

FIG. 14 indicates that the self-resonant frequency in the Y direction is 408 MHz, the self-resonant frequency in the X direction is 455 MHz and higher by approximately 11% than the self-resonant frequency in the Y direction, and the inductance component in the X direction is smaller by approximately 20% than the inductance component in the Y direction.

It is, therefore, preferable that the capacitors 110 and 210 included in the capacitor Cv1 according to the embodiment be arranged in such a manner that the direction in which the current of the power line flows is substantially parallel to the longitudinal directions of the capacitors 110 and 210 as EMC measures.

Next, a capacitor Cv2 according to another embodiment of the invention is described.

Figure 15:
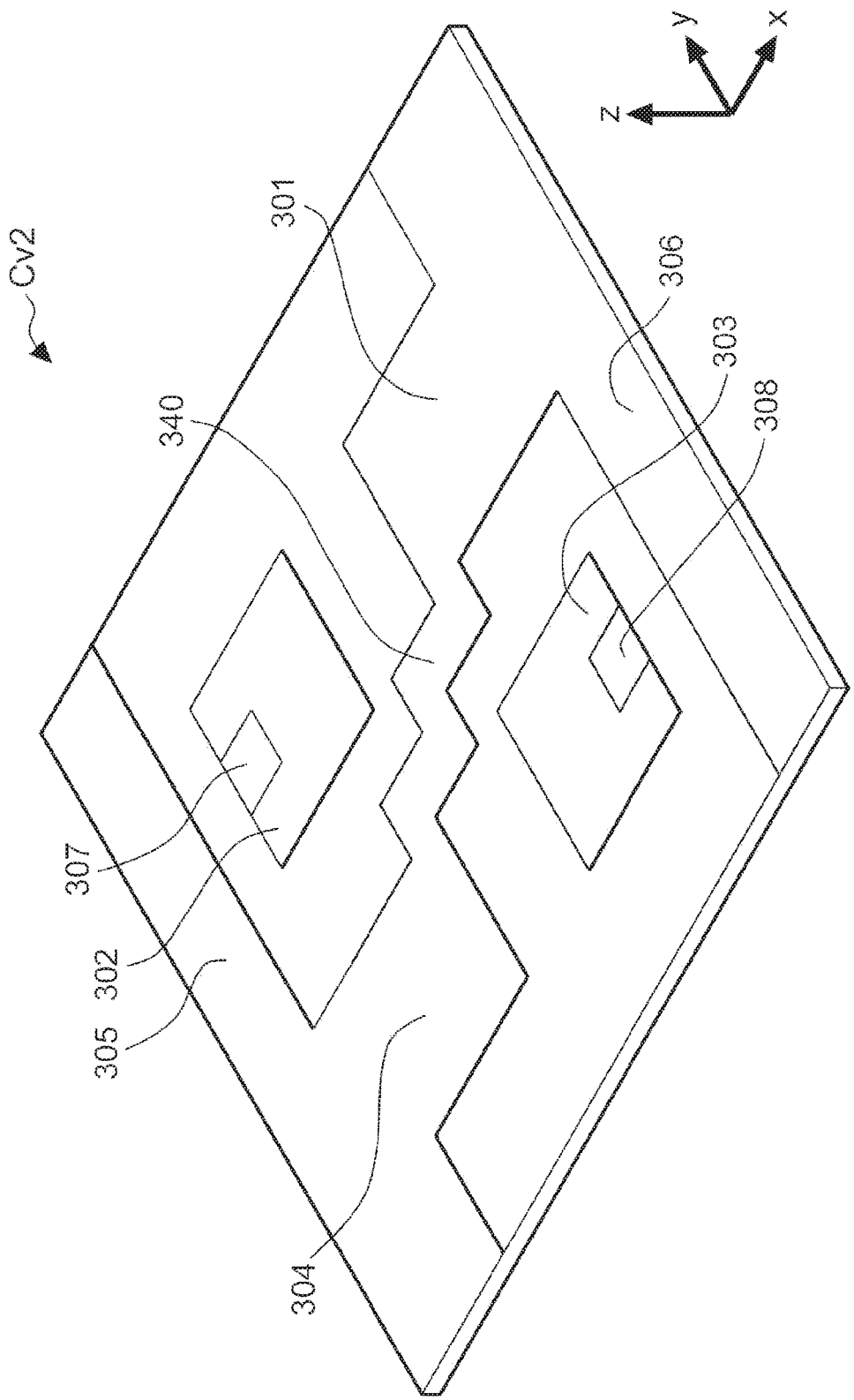
FIG. 15 is a diagram illustrating a part of a circuit substrate on which a capacitor according to another embodiment of the invention is mounted.

FIG. 15 illustrates a part of a circuit substrate on which the capacitor Cv2 is mounted. In FIG. 15, reference numerals that are the same as those illustrated in FIG. 11 indicate the same functions as those illustrated in FIG. 11. In FIG. 15, the capacitors 110 and 210 illustrated in FIG. 11 are arranged on the circuit substrate, but an illustration of the capacitors 110 and 210 is omitted. In the case where the capacitors 110 and 210 are mounted on the circuit substrate illustrated in FIG. 15, a circuit illustrated in FIG. 15 is equivalent with a circuit illustrated in FIG. 11.

In FIG. 15, the electrodes 311 and 312 illustrated in FIG. 11 are removed, but an electrode 340 is formed by patterning the first conductive layer. The electrode 340 electrically connects the electrode 301 connected to the first terminal 111 of the capacitor 110 and the electrode 304 connected to the fourth terminal 212 of the capacitor 210 to each other and is formed in a region between the capacitors 110 and 210 on the upper surface of the dielectric substrate 320.

Figure 16:
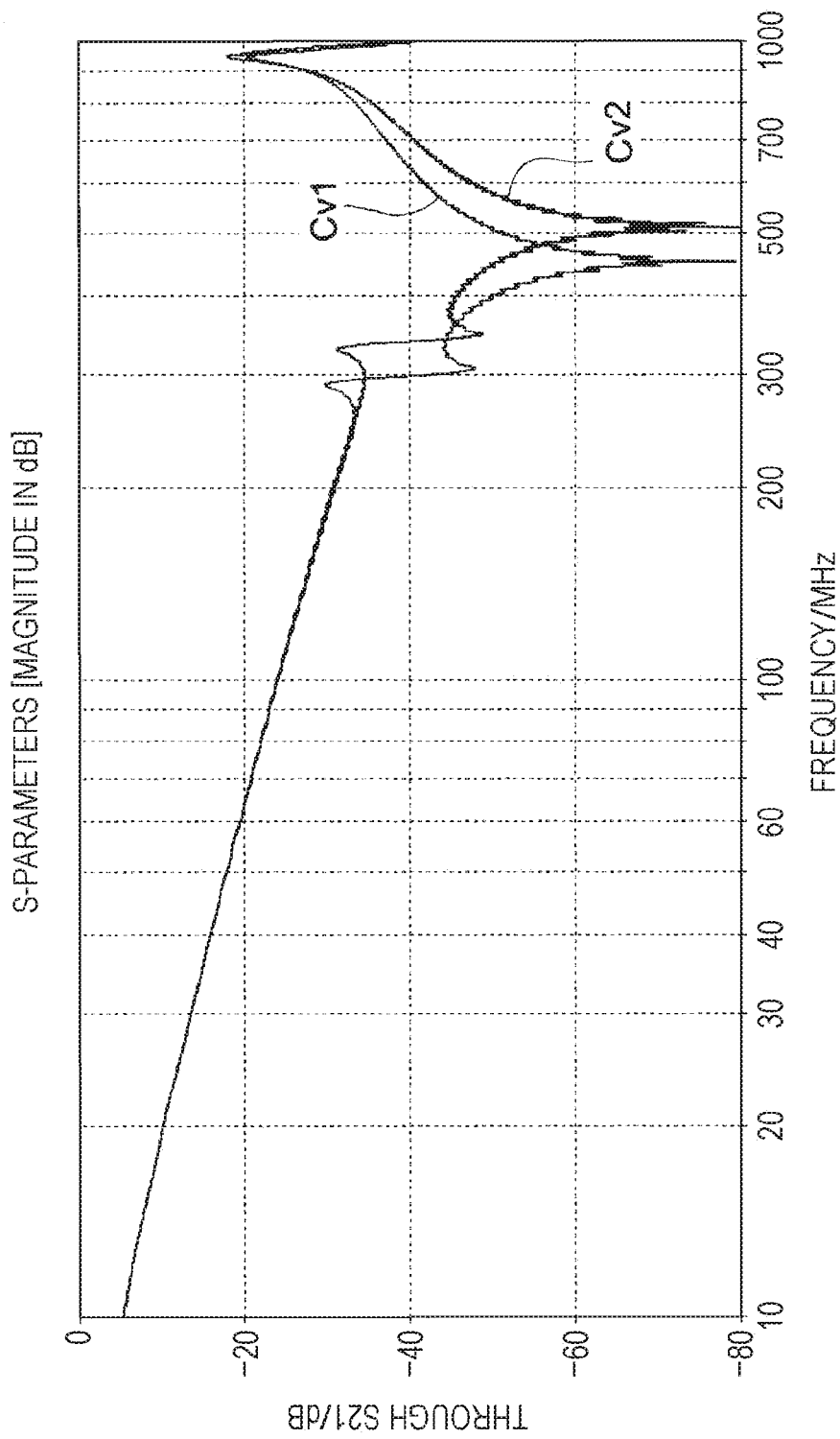
FIG. 16 is a diagram illustrating frequency characteristics of the capacitor according to the other embodiment.

FIG. 16 is a diagram illustrating the comparison of frequency characteristics (S21) of the capacitor Cv2 with frequency characteristics (S21) of the capacitor Cv1. In FIG. 16, the electrode 305 illustrated in FIGS. 11 and 15 is treated as an input side, and the electrode 306 illustrated in FIGS. 11 and 15 is treated as an output side.

FIG. 16 indicates that the self-resonant frequency of the capacitor Cv1 is 455 MHz, the self-resonant frequency of the capacitor Cv2 is 514 MHz and higher by approximately 13% than the self-resonant frequency of the capacitor Cv1, and the inductance component of the capacitor Cv2 is smaller by approximately 22% than the inductance component of the capacitor Cv1.

The inductance component of the capacitor Cv2 according to the other embodiment can be smaller than the inductance component of the capacitor Cv1, and the capacitor Cv2 is significantly preferable as EMC measures for the power line at the Vcc terminal of the IC.

In addition, since the electrodes 311 and 312 illustrated in FIG. 11 are removed, a region for the capacitor Cv2 can be small or a region for the electrodes 311 and 312 can be used for design of another electrode pattern.

Next, an application example other than the capacitors Cv1 and Cv2 is described.

In the aforementioned studies, regarding the capacitors 110 and 210 included in the capacitor Cv1 (Cv2) serving as the decoupling capacitor, directions in which the electrode layers electrically connected to the terminals 111, 112, 211, and 212 of the capacitors 110 and 210 in the capacitors 110 and 210 and the dielectric layers located between the electrode layers are stacked (superposed) are perpendicular to the surface of the dielectric substrate 320 on which components are mounted.

Figure 17:
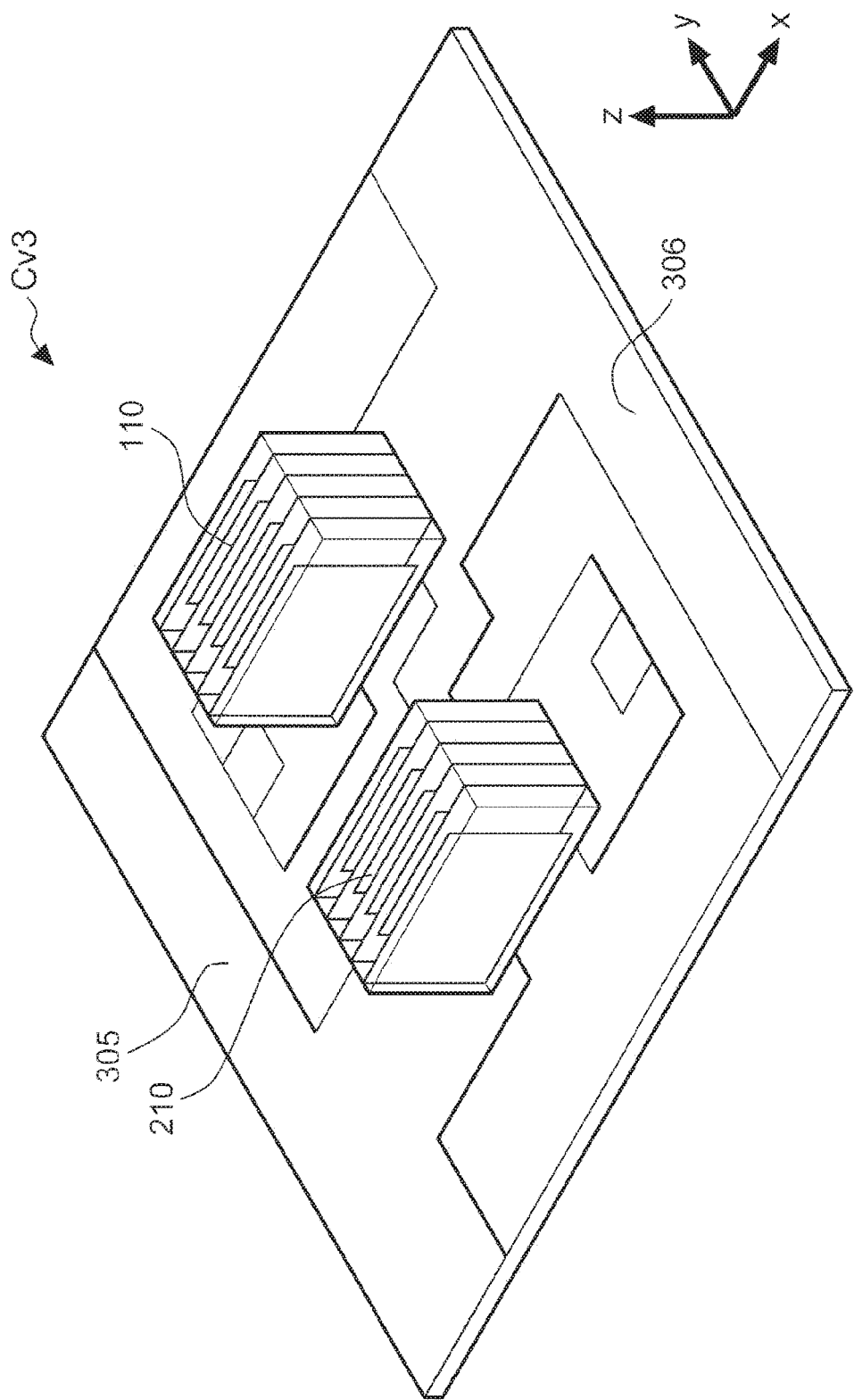
FIG. 17 is a diagram illustrating the configuration of a capacitor according to a still another embodiment of the invention.

The arrangement, however, is not limited to this. As illustrated in FIG. 17, directions in which the electrode layers and the dielectric layers are stacked in the capacitors 110 and 210 included in a capacitor Cv3 may be parallel to the upper surface of the dielectric substrate 320. While the directions in which the electrode layers and the dielectric layers are stacked in the capacitors 110 and 210 are parallel to the Z direction in FIG. 11, the directions in which the electrode layers and the dielectric layers are stacked in the capacitors 110 and 210 are parallel to the Y direction in FIG. 17.

As illustrated in FIG. 17, in the case where the directions in which the electrode layers and the dielectric layers are stacked in the capacitors 110 and 210 are parallel to the upper surface of the dielectric substrate 320, this arrangement can increase the self-resonant frequencies of the capacitors 110 and 210 mounted on the dielectric substrate 320 and reduce the inductance components of the capacitors 110 and 210.

Figure 18:
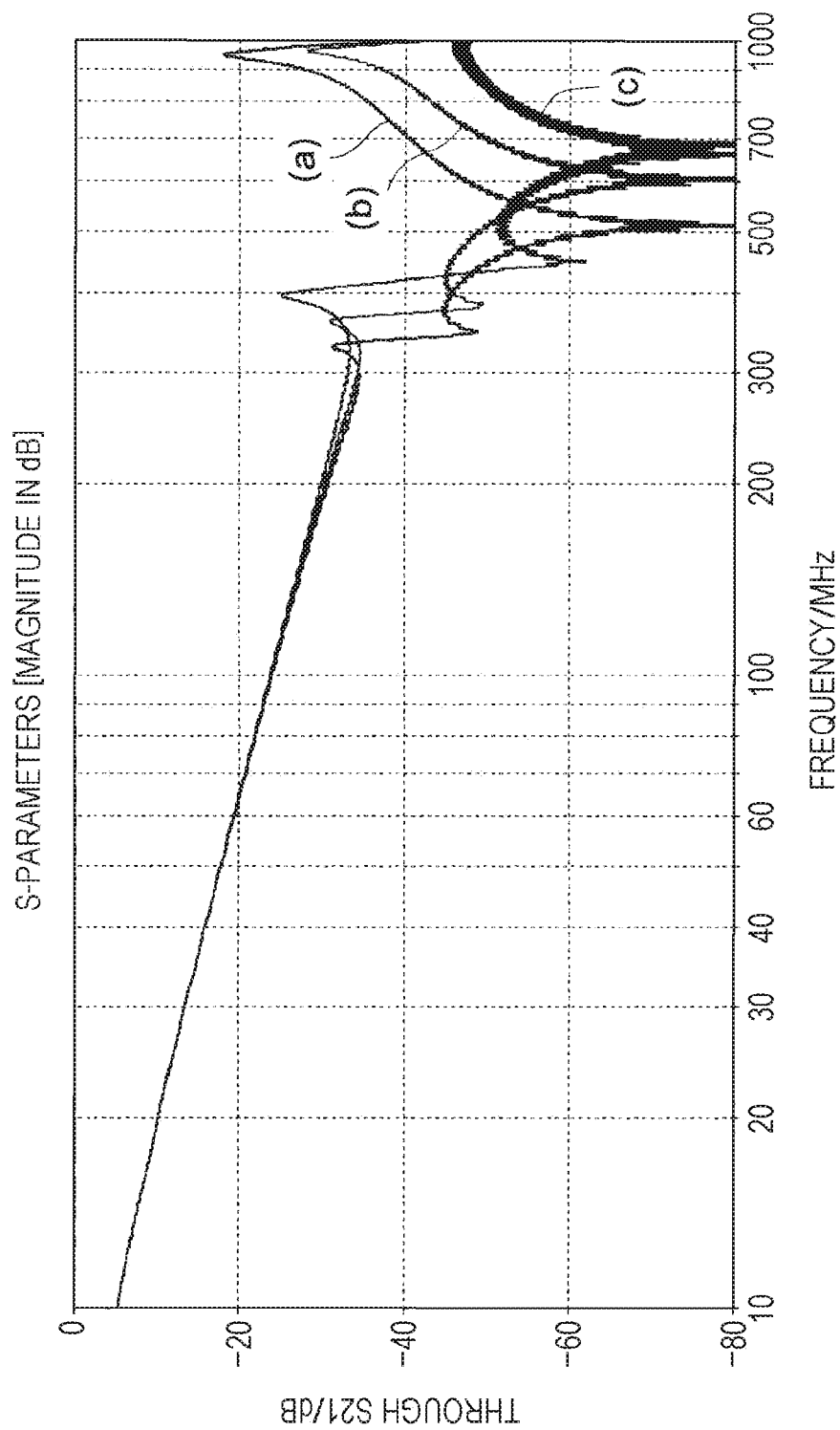
FIG. 18 is a diagram illustrating frequency characteristics of the capacitors with respect to different stacking directions.

FIG. 18 is a diagram illustrating results of comparing frequency characteristics (S21) in the case where the directions in which the electrode layers and the dielectric layers are stacked in the capacitors 110 and 210 vary.

Specifically, in FIG. 18, (a) indicates the case where the directions in which the electrode layers and the dielectric layers are stacked in the capacitors 110 and 210 are perpendicular to the upper surface of the dielectric substrate 320.

In FIG. 18, (b) indicates the case where either the direction in which the electrode layers and the dielectric layers are stacked in the capacitor 110 or the direction in which the electrode layers and the dielectric layers are stacked in the capacitor 210 is parallel to the upper surface of the dielectric substrate 320.

In FIG. 18, (c) indicates the case where the directions in which the electrode layers and the dielectric layers are stacked in the capacitors 110 and 210 are parallel to the upper surface of the dielectric substrate 320.

In any of the cases (a), (b), and (c), the electrode 305 is treated as an input side, and the electrode 306 is treated as an output side.

In FIG. 18, in the case (a), the self-resonant frequency is 514 MHz. The self-resonant frequency in the case (b) is 604 MHz and increased by approximately 18% compared with the case (a), and the inductance component in the case (b) can be reduced by approximately 28% compared with the case (a).

The self-resonant frequency in the case (c) is 681 MHz and increased by approximately 33% compared with the case (a), and the inductance component in the case (c) can be reduced by approximately 43% compared with the case (a).

It is, therefore, preferable that the capacitors 110 and 210 be mounted on the dielectric substrate 320 in such a manner that the directions in which the electrode layers and the dielectric layers are stacked in the capacitors 110 and 210 are parallel to the upper surface of the dielectric substrate 320. By this arrangement, results that are preferable as EMC measures are obtained.

While it is preferable that the directions in which the layers are stacked be parallel to the upper surface of the dielectric substrate 320, directions in which surfaces of layers stacked in chip-type capacitors extend (or directions in which the layers are stacked in the chip-type capacitors) are not known in the related art. In addition, as described later, since the chip-type capacitors tend to have substantially square side surfaces located on the side of terminals, the chip-type capacitors are not easily distinguished based on longitudinal or transverse directions of the chip-type capacitors.

It is, therefore, preferable that clearly visible signs (marks) indicating information on the directions in which the surfaces of the layers of the capacitors 110 and 210 extend (or the directions in which the layers of the capacitors 110 and 210 are stacked) be formed on the upper surfaces of the capacitors 110 and 210.

Specifically, before a task of mounting the capacitors 110 and 210 on the dielectric substrate 320, the directions in which the electrode layers and the dielectric layers are stacked in the chip-type capacitors 110 and 210 can match each other based on the signs. During the task of mounting the capacitors 110 and 210, the signs can be recognized, the directions in which the electrode layers and the dielectric layers are stacked can match each other and can be parallel to the upper surface of the dielectric substrate 320 on which the components are mounted. After the task of mounting the capacitors 110 and 210, the directions in which the layers are stacked in the capacitors 110 and 210 can be easily confirmed in appearance inspection.

Figure 19:
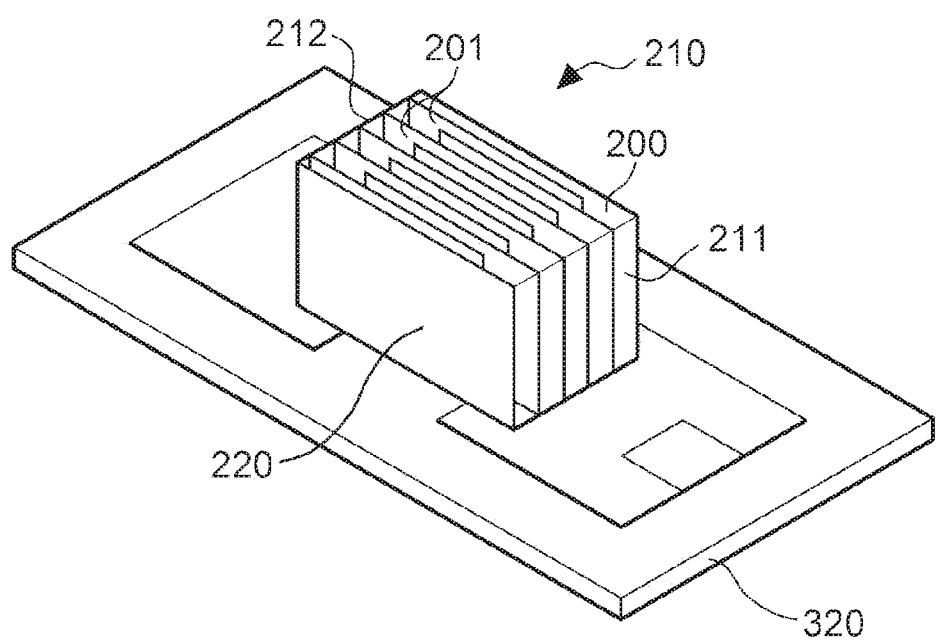
FIG. 19 is a diagram illustrating an example of a capacitor having a sign.

FIG. 19 is a diagram illustrating the configuration of the capacitor 210 having a sign. In order to simplify the following description, only the capacitor 210 is illustrated in FIG. 19.

As illustrated in FIG. 19, in the chip-type capacitor 210, dielectric layers 200 and electrode layers 201 connected to multiple terminals are stacked. Specifically, electrode layers 201 commonly connected to the third terminal 211 and electrode layers 201 commonly connected to the fourth terminal 212 are alternately stacked in such a manner that each of the dielectric layers 200 is located between an electrode layer 201 connected to the third terminal 211 and an electrode layer 201 connected to the fourth terminal 212.

The sign 220 is formed on an outer surface of the capacitor 210. Specifically, the outer surface of the capacitor 210 having a stacked structure is among six surfaces of the rectangular parallelepiped capacitor 210 and is color-coded to distinguish the outer surface with the other surfaces. Although the sign 220 is formed on the aforementioned outer surface of the capacitor 210, another sign 220 may be formed on an outer surface, opposite to the aforementioned outer surface, of the capacitor 210.

In FIG. 19, the sign 220 is color-coded on the entire outer surface. However, the size of the sign 220 is arbitrary as long as the sign 220 can be recognized. It is preferable that the sign 220 be colored with a color different from the original surfaces of the capacitor 210, but the outer surface of the capacitor 210 may be engraved with the sign 220 using laser light or the like.

In FIG. 19, since the sign 220 is perpendicular to the surface of the dielectric substrate 320 on which the components are mounted, the sign 220 can be visually recognized from the horizontal direction in which the upper surface of the dielectric substrate 320 extends or from an oblique direction with respect to the horizontal direction.

As described above, if the other sign is formed on the surface opposite to the surface on which the sign 220 is formed, and the capacitor 210 is viewed from the direction perpendicular to the surface of the dielectric substrate 320 on which the components are mounted, it is possible to confirm that the sings are not visually recognized and to confirm that the direction in which the electrode layers and the dielectric layers are stacked in the capacitor 210 is parallel to the upper surface of the dielectric substrate 320 on which the components are mounted.

Regarding the formation of the sign 220, it is preferable that a surface in which the third terminal 211 is formed and that is included in the capacitor 210 and a surface in which the fourth terminal 212 is formed and that is included in the capacitor 210 be substantially squares. If the size of a general chip-type capacitor is reduced to a 1608 size (1.6 mm×0.8 mm that are the sizes of sides of an upper surface of the general chip-type capacitor on which components are mounted), the number of electrode layers to be stacked is increased to obtain a sufficient capacitance value. In addition, if the size of the general chip-type capacitor is further reduced to the 1005 size (1.0 mm×0.5 mm that are the sizes of the sides of the upper surface of the general chip-type capacitor on which the components are mounted), the number of electrode layers to be stacked is further increased to obtain a sufficient capacitance value. Thus, surfaces that are included in the general chip-type capacitor and in which the terminals are formed tend to be substantially squares.

Especially, if the general chip-type capacitor is used as a decoupling capacitor, a relatively large capacitance value of 0.1 µF is necessary, and the surfaces in which the terminals are formed are substantially squares. Thus, a direction in which electrode layers and dielectric layers are stacked may not be recognized based on only the shape of the capacitor. In this example, however, the stacking direction can be visually recognized by forming the sign 220.

It is preferable that the sign 220 be formed on a certain surface among the surfaces that are included in the capacitor 210 and parallel to the direction in which the electrode layers and the dielectric layers are stacked in the capacitor 210 or that the signs 220 be formed on the certain surface and a surface included in the capacitor 210 and opposite to the certain surface. This is due to the fact that, in a process of manufacturing the chip-type capacitor, the dielectric layers 200 and the electrode layers 201 are formed as a unified stacked body and divided after the formation of the unified stacked body. Thus, after the formation of unified stacked bodies, signs 220 can be integrally formed on upper or lower surfaces of the stacked bodies. Thus, signs 220 can be formed on a large number of capacitors within a short time period, and the cost required for the formation of the signs 220 can be reduced.

The capacitors 110 and 210 are mounted in accordance with a rule (pattern and space design rule for electrode patterns of component pads to be used to mount the components) for implementation on the dielectric substrate 320. It is preferable that the capacitors 110 and 210 be mounted in such a manner that the capacitors 110 and 210 are minimized in accordance with the implementation rule.

A space (gap) between the capacitors 110 and 210 when the capacitors 110 and 210 are mounted on the dielectric substrate 320 is 0.5 mm, for example. If it is possible to reduce the gap as an implementation technique, it is preferable that the capacitors 110 and 210 be mounted in such a manner that the gap between the capacitors 110 and 210 is smaller in order to reduce the inductance components.

This is due to the fact that the high-frequency currents flow from the side of the Vcc terminal to the side of the ground (GND) in the antiparallel directions and that high-frequency magnetic fields generated in spaces located close to the capacitors 110 and 210 due to the high-frequency currents flowing in the antiparallel directions are offset. Due to the relationship of the offset, the mutual inductance is a negative value as described above and reduces the inductance components (self-inductance) of the capacitors 110 and 210.

Capacitors that are easily obtainable in general may be used as the capacitors 110 and 210, but the gap between the capacitors 110 and 210 is limited in order to stabilize a process of mounting components upon mass production, as described above. As a method of reducing the gap, the capacitors 110 and 210 may be formed as a unified component.

If the capacitors 110 and 210 are formed as the unified component, the gap between the capacitors 110 and 210 can be set to a value close to the minimum space (margin) according to a rule for patterning the electrodes in a formation process. In this case, since an absolute value of the negative mutual inductance of the capacitors 110 and 210 is large, the inductance components (self-inductance) of the capacitors 110 and 210 can be reduced.

As the decoupling capacitor with a sufficient large capacitance value, a capacitor with a capacitance of 0.1 µF is used based on experiments in many cases. Thus, each of the embodiments describes the case where two capacitors having capacitance values of approximately 0.1 µF are used. However, if the design indicates that the capacitance value of an entire decoupling capacitor is approximately 0.1 µF, chip-type capacitors having capacitance values of 0.047 µF may be connected in parallel in the decoupling capacitor.

According to this configuration, the capacitance value of the entire decoupling capacitor is approximately 0.1 µF, and the self-resonant frequency of the decoupling capacitor increases by approximately 40% compared with the case where two capacitors having capacitance values of 0.1 µF are used. Thus, a configuration in which the capacitance value of the entire decoupling capacitor is ensured by reducing the capacitance values of the capacitors to be mounted is effective as EMC measures for the power line. In this case, the inductance component does not produce an effect more excellent than the reduction effect described in the embodiments.

Each of the embodiments describes the case where two chip-type capacitors are used. In the case where high-frequency currents flow in antiparallel directions, the number of capacitors included in a decoupling capacitor is not limited and may be three or more. If the number of capacitors included in each of the decoupling capacitors is three or more, the inductance of the entire decoupling capacitor can be low and this configuration is more preferable as EMC measures.

What is claimed is:

1. A printing apparatus, comprising:
   a plurality of operating units including a printing unit that forms an image on a medium; and
   a power supply unit that supplies power to the plurality of operating units, wherein the printing apparatus has a plurality of functions including a printing function of forming an image on a medium and is capable of executing printing with resolution of 300 dpi or more, the power supply unit includes a circuit substrate including
a first layer that is a surface layer being conductive,
a first wiring pattern formed of the first layer,
a second layer that is conductive and different from the first layer, and
a second wiring pattern formed of the second layer, and
first and second capacitors formed on the surface layer,
the first capacitor includes a first terminal and a second terminal,
the second capacitor includes a third terminal and a fourth terminal,
the circuit substrate includes
a first electrode connecting the first terminal of the first capacitor to the first wiring pattern,
a second electrode connecting the second terminal of the first capacitor to the second wiring pattern,
a third electrode connecting the third terminal of the second capacitor to the second wiring pattern, and
a fourth electrode connecting the fourth terminal of the second capacitor to the first wiring pattern, and
a first direction from the first terminal to the second terminal and a second direction from the third terminal to the fourth terminal are substantially parallel to a power transmission direction from a power supply component side of a power line to a load component side of the power line on the circuit substrate.

2. The printing apparatus according to claim 1, wherein the first wiring pattern includes a wiring portion between regions in which the first and second capacitors are mounted.

3. The printing apparatus according to claim 1, wherein the second wiring pattern is located on a low-voltage side of the power supply unit.

4. The printing apparatus according to claim 1, wherein the second wiring pattern is a solid-like pattern located on a low-voltage side of the power supply unit, and
the second electrode and the third electrode are connected to the second wiring pattern through vias.

5. The printing apparatus according to claim 4, wherein each of the first and second capacitors has a multilayer structure in which an electrode layer and a dielectric layer are stacked, and
at least one of stacking directions of the first and second capacitors is substantially parallel to a surface of the circuit substrate on which components are mounted.

6. The printing apparatus according to claim 1, wherein the first wiring pattern includes a wiring portion between regions in which the first and second capacitors are mounted, and
the second wiring pattern is located on a low-voltage side of the power supply unit.

7. A power supply unit, comprising:
a circuit substrate including
a first layer that is a surface layer being conductive,
a first wiring pattern formed of the first layer,
a second layer that is conductive and different from the first layer, and
a second wiring pattern formed of the second layer, and
first and second capacitors formed on the surface layer, wherein
the power supply unit is used for a printing apparatus that has a plurality of functions including a printing function of forming an image on a medium and is capable of executing printing with resolution of 300 dpi or more,
the first capacitor includes a first terminal and a second terminal,
the second capacitor includes a third terminal and a fourth terminal,
the circuit substrate includes
a first electrode connecting the first terminal of the first capacitor to the first wiring pattern,
a second electrode connecting the second terminal of the first capacitor to the second wiring pattern,
a third electrode connecting the third terminal of the second capacitor to the second wiring pattern, and
a fourth electrode connecting the fourth terminal of the second capacitor to the first wiring pattern, and
a first direction from the first terminal to the second terminal and a second direction from the third terminal to the fourth terminal are substantially parallel to a power transmission direction from a power supply component side of a power line to a load component side of the power line on the circuit substrate.

8. The power supply unit according to claim 7, wherein the first wiring pattern includes a wiring portion between regions in which the first and second capacitors are mounted.

9. The power supply unit according to claim 7, wherein the second wiring pattern is located on a low-voltage side of the power supply unit.

10. The power supply unit according to claim 7, wherein the second wiring pattern is a solid-like pattern located on a low-voltage side of the power supply unit, and
the second electrode and the third electrode are connected to the second wiring pattern through vias.

11. The power supply unit according to claim 10, wherein each of the first and second capacitors has a multilayer structure in which an electrode layer and a dielectric layer are stacked,
at least one of stacking directions of the first and second capacitors is substantially parallel to a surface of the circuit substrate on which components are mounted.

12. The power supply unit according to claim 7, wherein the first wiring pattern includes a wiring portion between regions in which the first and second capacitors are mounted, and
the second wiring pattern is located on a low-voltage side of the power supply unit.

* * * * *